(12) United States Patent
Takekida et al.

(10) Patent No.: US 12,490,435 B2
(45) Date of Patent: Dec. 2, 2025

(54) SEMICONDUCTOR STORAGE DEVICE AND MANUFACTURING METHOD THEREOF

(71) Applicant: Kioxia Corporation, Tokyo (JP)

(72) Inventors: Hideto Takekida, Nagoya Aichi (JP); Keisuke Suda, Yokkaichi Mie (JP); Naoyuki Iida, Yokkaichi Mie (JP); Kohei Nyui, Yokkaichi Mie (JP); Ryo Hikida, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 594 days.

(21) Appl. No.: 17/898,944

(22) Filed: Aug. 30, 2022

(65) Prior Publication Data

US 2023/0276626 A1    Aug. 31, 2023

(30) Foreign Application Priority Data

Feb. 25, 2022   (JP) ................. 2022-027698

(51) Int. Cl.
| | |
|---|---|
| *H01L 23/528* | (2006.01) |
| *H10B 41/10* | (2023.01) |
| *H10B 41/27* | (2023.01) |
| *H10B 43/10* | (2023.01) |
| *H10B 43/27* | (2023.01) |

(52) U.S. Cl.
CPC ......... *H10B 43/27* (2023.02); *H01L 23/5283* (2013.01); *H10B 41/10* (2023.02); *H10B 41/27* (2023.02); *H10B 43/10* (2023.02)

(58) Field of Classification Search
CPC ........ H10B 41/27; H10B 43/10; H10B 43/27; H10D 64/037
See application file for complete search history.

(56) References Cited

U.S. PATENT DOCUMENTS

| | | | |
|---|---|---|---|
| 10,242,998 B2 * | 3/2019 | Shimura | ................ H10B 43/35 |
| 2016/0071881 A1 | 3/2016 | Lee et al. | |
| 2016/0268263 A1 | 9/2016 | Lee et al. | |
| 2019/0355742 A1 | 11/2019 | Maruyama et al. | |

(Continued)

FOREIGN PATENT DOCUMENTS

| | | |
|---|---|---|
| JP | 2019-201074 A | 11/2019 |
| TW | 202147553 A | 12/2021 |
| TW | 1753772 B | 1/2022 |

*Primary Examiner* — Jaehwan Oh
(74) *Attorney, Agent, or Firm* — Foley & Lardner LLP

(57) ABSTRACT

A semiconductor storage device includes: a first semiconductor layer through first conductive layers; a gate insulating film between the first conductive layers and the first semiconductor layer; a first structure facing the first conductive layers; a second semiconductor layer connected to the first semiconductor layer and the first structure; a third semiconductor layer between the second semiconductor layer and the first conductive layers; a fourth semiconductor layer including a first portion along a bottom surface of the third semiconductor layer and a second portion along a top surface of the second semiconductor layer; and a first insulating layer, between the first and second portions, including a first region spaced from the first structure with a distance longer than a first distance that contains a nitride film, and a second region spaced from the first structure with a distance shorter than the first distance that does not contain nitrogen.

12 Claims, 38 Drawing Sheets

(56) References Cited

U.S. PATENT DOCUMENTS

| | | |
|---|---|---|
| 2020/0075625 A1* | 3/2020 | Kobayashi ............. H10B 43/35 |
| 2020/0091181 A1* | 3/2020 | Nagashima ............ H10B 43/27 |
| 2020/0176472 A1 | 6/2020 | Shimura |
| 2020/0411536 A1 | 12/2020 | Kim et al. |
| 2021/0175241 A1 | 6/2021 | Ryu et al. |
| 2021/0265374 A1 | 8/2021 | Iwasaki |
| 2021/0265380 A1 | 8/2021 | Obu et al. |
| 2021/0280601 A1* | 9/2021 | Kashiyama ............ H10B 41/30 |
| 2022/0059462 A1 | 2/2022 | Said et al. |
| 2022/0181351 A1 | 6/2022 | Wang et al. |

* cited by examiner

SEMICONDUCTOR STORAGE DEVICE AND MANUFACTURING METHOD THEREOF

CROSS-REFERENCE TO RELATED APPLICATION(S)

This application is based upon and claims the benefit of priority from Japanese Patent Application No. 2022-027698, filed Feb. 25, 2022, the entire contents of which are incorporated herein by reference.

FIELD

Embodiments described herein relate generally to a semiconductor storage device and a manufacturing method thereof.

BACKGROUND

In general, a semiconductor storage device may include a plurality of conductive layers arranged in a first direction, a semiconductor layer extending in the first direction and facing the plurality of conductive layers, and a charge storage portion provided between the plurality of conductive layers and the semiconductor layer.

DETAILED DESCRIPTION

Figure 1:
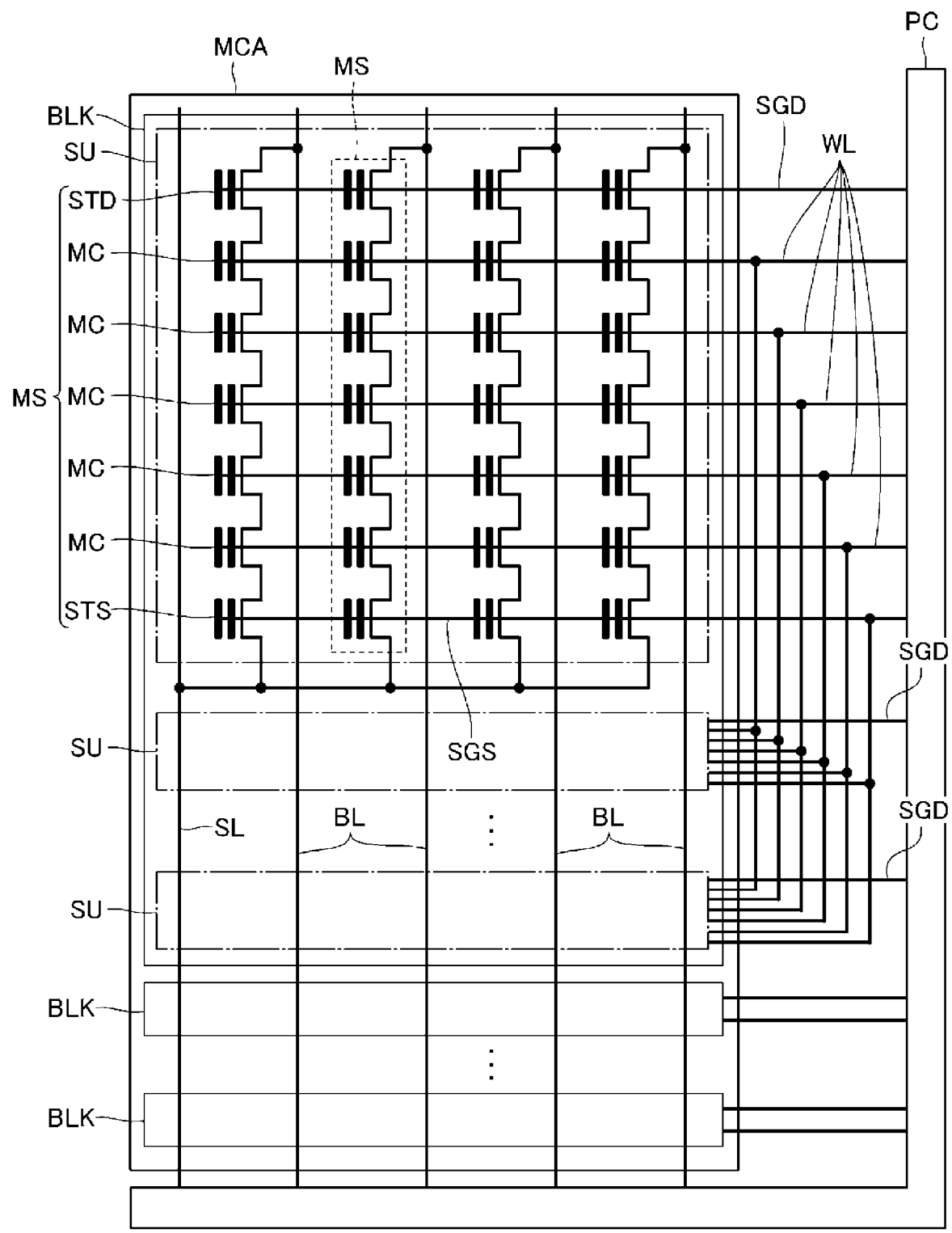
FIG. 1 is a schematic circuit diagram illustrating a configuration of a portion of a semiconductor storage device according to a first embodiment.

Embodiments provide a semiconductor storage device which may be appropriately manufactured, and a manufacturing method thereof.

In general, according to one embodiment, a semiconductor storage device includes: a plurality of first conductive layers arranged in a first direction; a first semiconductor layer extending in the first direction, and facing the plurality of first conductive layers; a gate insulating film provided between the plurality of first conductive layers and the first semiconductor layer, and including a charge storage portion; a first structure extending in the first direction and a second direction intersecting the first direction, and facing the plurality of first conductive layers; a second semiconductor layer connected to one end of the first semiconductor layer via a portion of the gate insulating film, connected to one end of the first structure, and extending in the second direction; a third semiconductor layer provided between the second semiconductor layer and the plurality of first conductive layers, connected to the first semiconductor layer via a portion of the gate insulating film, and extending in the second direction; a fourth semiconductor layer connected to the third semiconductor layer, and including a first portion provided along a bottom surface of the third semiconductor layer and a second portion provided along a top surface of the second semiconductor layer; and a first insulating layer provided between the first and second portions of the fourth semiconductor layer. The first insulating layer including a first region of which a distance from the first structure is longer than a first distance, and a second region of which a distance from the first structure is shorter than the first distance. The first region contains a nitride film, and the second region does not contain nitrogen (N).

Hereinafter, a semiconductor storage device and a manufacturing method thereof according to embodiments will be described in detail with reference to the accompanying drawings. Meanwhile, the embodiments described herein below are merely examples, and are not intended to limit the present disclosure. Further, the drawings are schematic, and may omit some components and others for the convenience of description. Further, common components in the plurality of embodiments will be denoted by the same reference numerals, and descriptions thereof may be omitted.

Further, the "semiconductor storage device" in the descriptions herein may indicate a memory die or a memory system including a controller die, such as a memory chip, a memory card, an SSD (solid state drive) or the like. Further, the "semiconductor storage device" may indicate a configuration including a host computer such as a smart phone, a tablet terminal, a personal computer or the like.

Further, herein, the description that a first component is "connected between" second and third components may indicate that the first, second, and third components are connected in series, and the second component is connected to the third component via the first component.

Further, in the descriptions herein, a predetermined direction parallel to the upper surface of a substrate will be referred to as an X direction, a direction parallel to the upper surface of the substrate and perpendicular to the X direction will be referred to as a Y direction, and a direction vertical to the upper surface of the substrate will be referred to as a Z direction.

Further, in the descriptions herein, a direction along a predetermined plane may be referred to as a first direction, a direction intersecting the first direction along the predetermined plane may be referred to as a second direction, and a direction intersecting the predetermined plane may be referred to as a third direction. Each of the first, second, and third directions may or may not correspond to any of the X, Y, and Z directions.

Further, in the descriptions herein, the criterion for expressions such as "upper", "lower" and the like is the substrate. For example, the direction away from the substrate along the Z direction will be referred to as an upward direction, and the direction that approaches the substrate along the Z direction will be referred to as a downward direction. Further, the lower surface or end of a certain component indicates the surface or end of the component that faces the substrate, and the upper surface or end of the component indicates the surface or end of the component opposite to the substrate. Further, the surface of the component that intersects the X or Y direction will be referred to as a side surface or the like of the component.

Further, in the descriptions herein, the "width", "length", "thickness" or the like of a component, a member or the like in a predetermined direction may indicate the width, length, thickness or the like of the cross section of the component that is observed by an SEM (scanning electron microscopy), a TEM (transmission electron microscopy) or the like.

First Embodiment

[Circuit Configuration of Semiconductor Storage Device]

FIG. 1 is a schematic circuit diagram illustrating a configuration of a portion of a semiconductor storage device according to a first embodiment. The semiconductor storage device according to the first embodiment includes a memory cell array MCA and a peripheral circuit PC.

[Configuration of Memory Cell Array MCA]

The memory cell array MCA includes a plurality of memory blocks BLK. Each of the plurality of memory blocks BLK includes a plurality of string units SU. Each of the plurality of string units SU includes a plurality of memory strings MS. One end of each of the plurality of memory strings MS is connected to the peripheral circuit PC via a bit line BL. Further, the other end of each of the plurality of memory strings MS is connected to the peripheral circuit PC via a common source line SL.

Each memory string MS includes a drain-side select transistor STD, a plurality of memory cells MC (memory transistors), and a source-side select transistor STS. The drain-side select transistor STD, the plurality of memory cells MC, and the source-side select transistor STS are connected in series between the bit line BL and the source line SL. Hereinafter, the drain-side select transistor STD and the source-side select transistor STS may simply be referred to as select transistors STD and STS.

Each memory cell MC is a field-effect type transistor. The memory cell MC includes a semiconductor layer, a gate insulating film, and a gate electrode. The semiconductor layer functions as a channel region. The gate insulating film includes a charge storage film. A threshold voltage of the memory cell MC varies according to a charge amount in the charge storage film. The memory cell MC stores one-bit data or multi-bit data. Meanwhile, word lines WL are connected to the respective gate electrodes of the plurality of memory cells MC corresponding to one memory string MS. The word lines WL are commonly connected to all of the memory strings MS, respectively, in one memory block BLK.

The select transistors STD and STS are field-effect type transistors. Each of the select transistors STD and STS includes a semiconductor layer, a gate insulating film, and a gate electrode. The semiconductor layer functions as a channel region. Select gate lines SGD and SGS are connected to the gate electrodes of the select transistors STD and STS, respectively. One drain-side select gate line SGD is commonly connected to all of the memory strings MS in one string unit SU. One source-side select gate line SGS is commonly connected to all of the memory strings MS in one memory block BLK.

[Configuration of Peripheral Circuit PC]

The peripheral circuit PC includes, for example, a voltage generation circuit that generates an operation voltage, a voltage transfer circuit that transfers the generated operation voltage to a selected bit line BL, a word line WL, the source line SL, the select gate lines SGD and SGS and others, a sense amplifier module connected to the bit line BL, and a sequencer that controls the components.

[Structure of Semiconductor Storage Device]

[Plane Layout]

Figure 2:
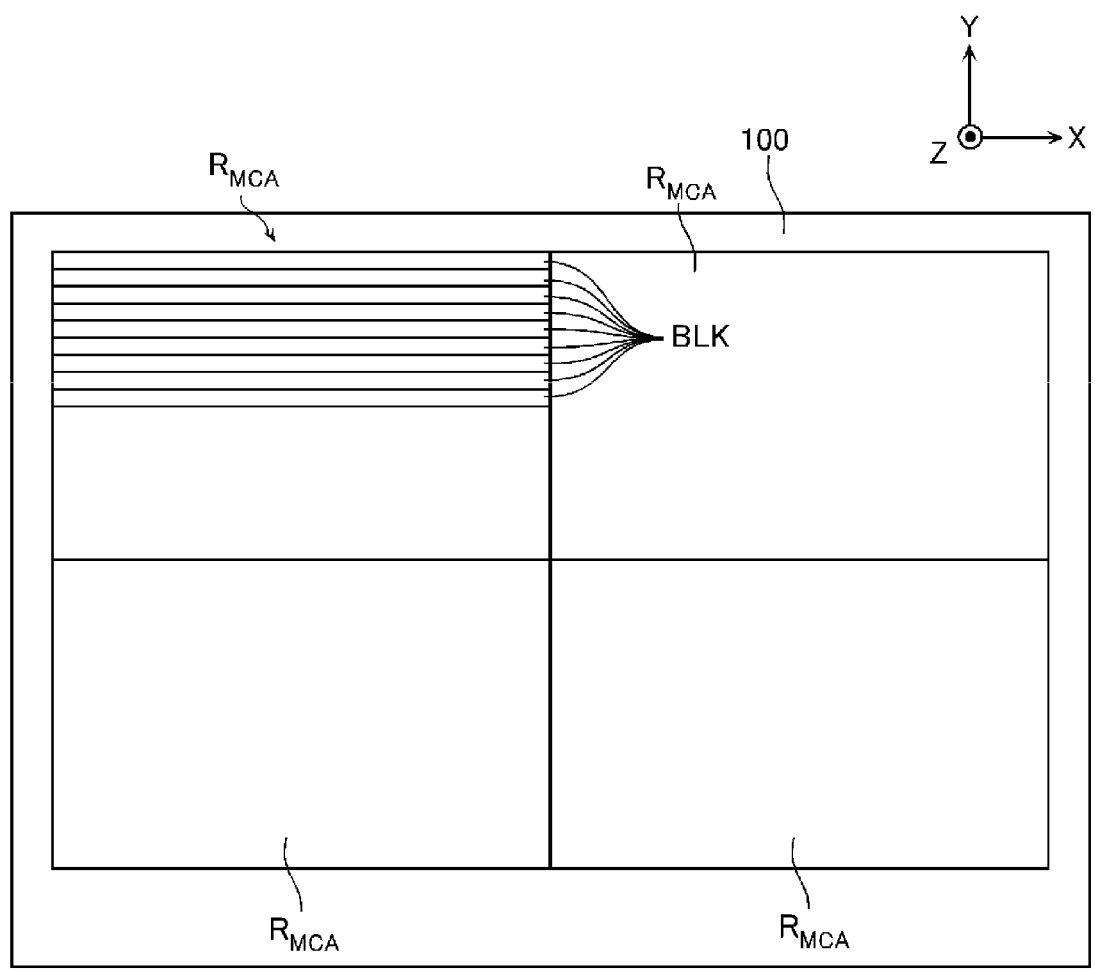
FIG. 2 is a schematic plan view illustrating a configuration of a portion of the same semiconductor storage device.

FIG. 2 is a schematic plan view illustrating a configuration of a portion of the semiconductor storage device according to the first embodiment. The semiconductor storage device according to the present embodiment includes a semiconductor substrate 100. The semiconductor substrate 100 is made of, for example, P-type silicon (Si) containing P-type impurities such as boron (B) or the like. In the illustrated example, four memory cell array regions $R_{MCA}$ are arranged in the X and Y directions in the semiconductor substrate 100. Further, a plurality of memory blocks BLK are arranged in the Y direction in each memory cell array region $R_{MCA}$.

[More Detailed Structure of Semiconductor Storage Device]

Figure 3:
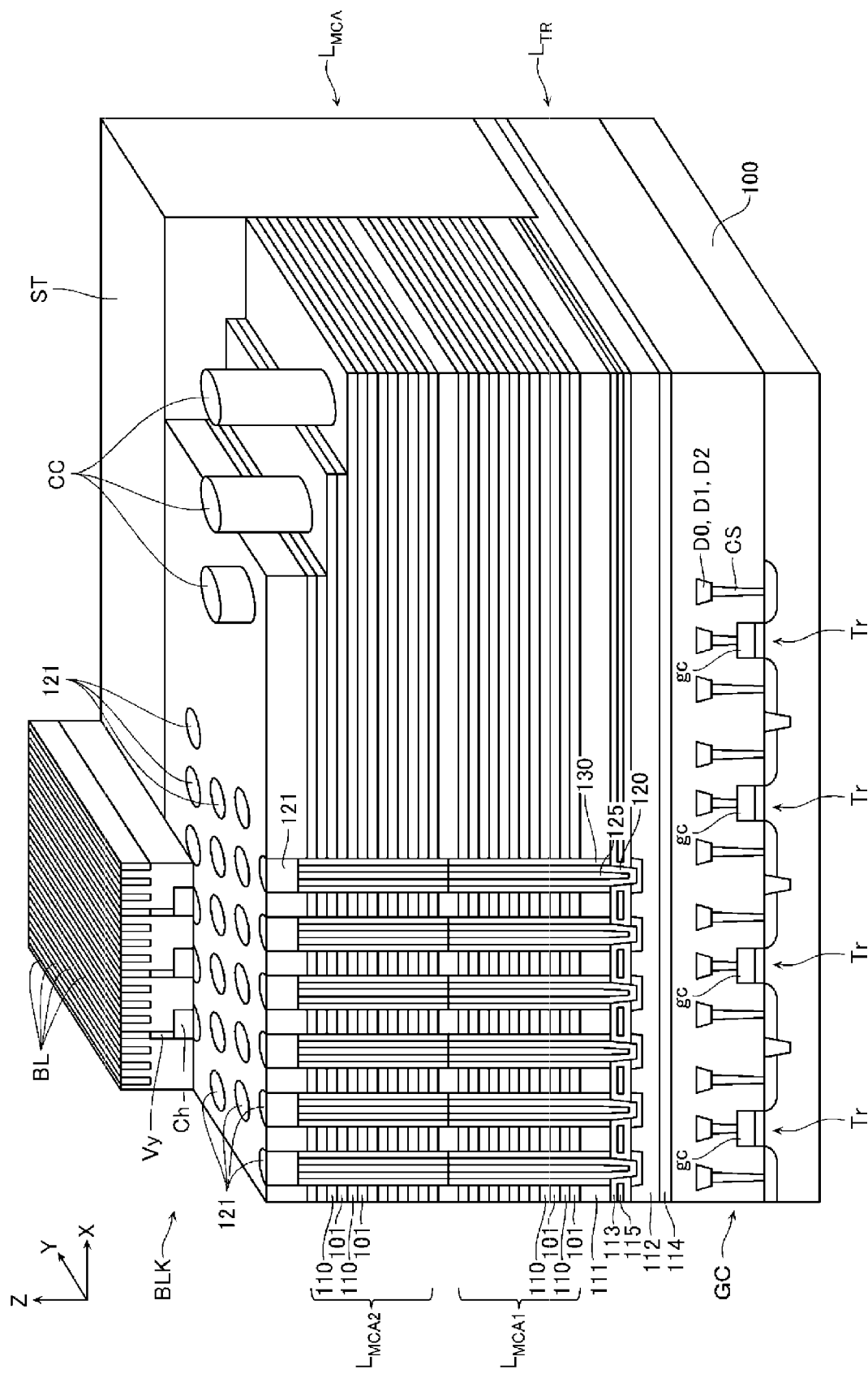
FIG. 3 is a schematic perspective view illustrating a configuration of a portion of the same semiconductor storage device.
Figure 4:
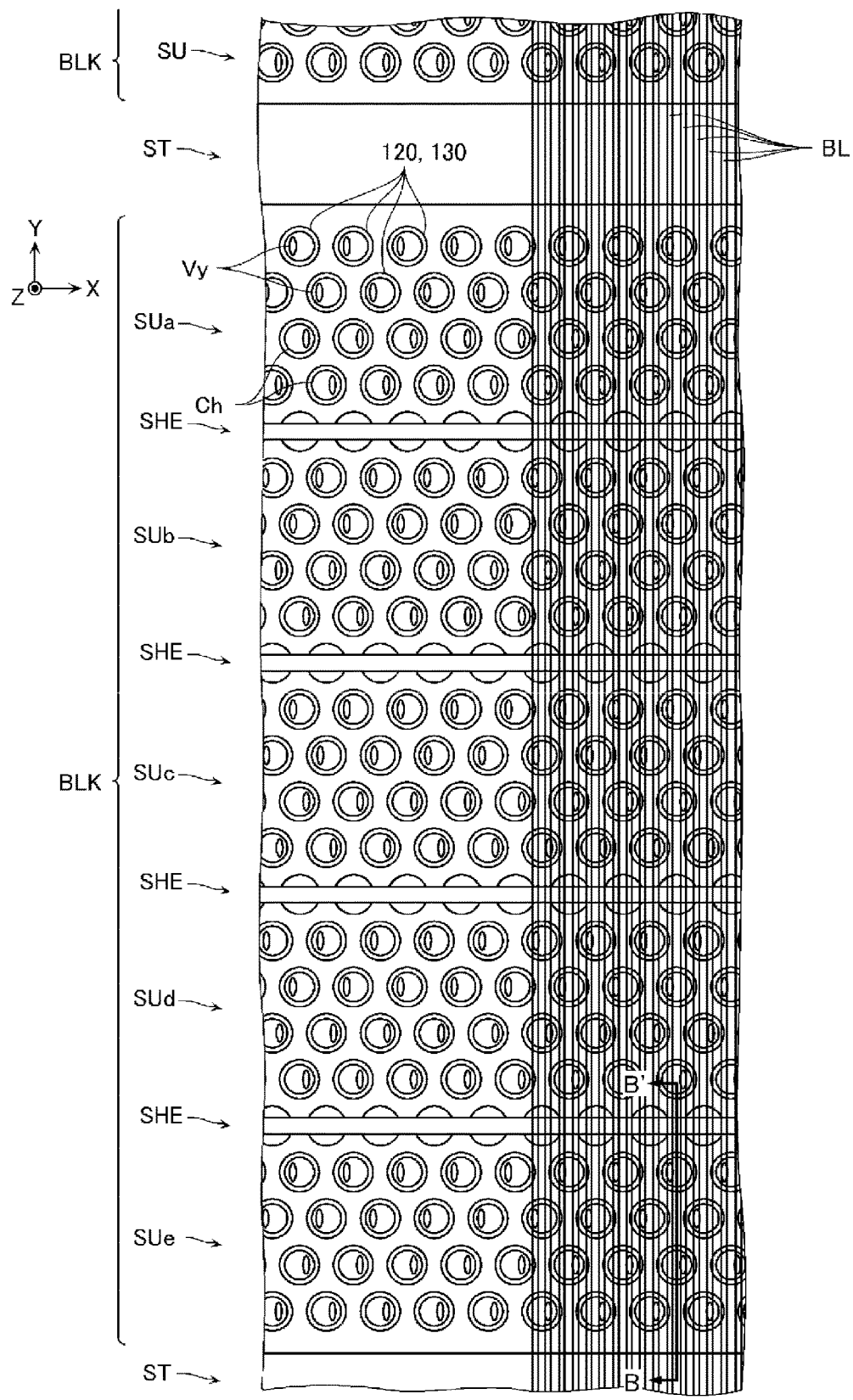
FIG. 4 is a schematic plan view illustrating a configuration of a portion of the same semiconductor storage device.
Figure 5:
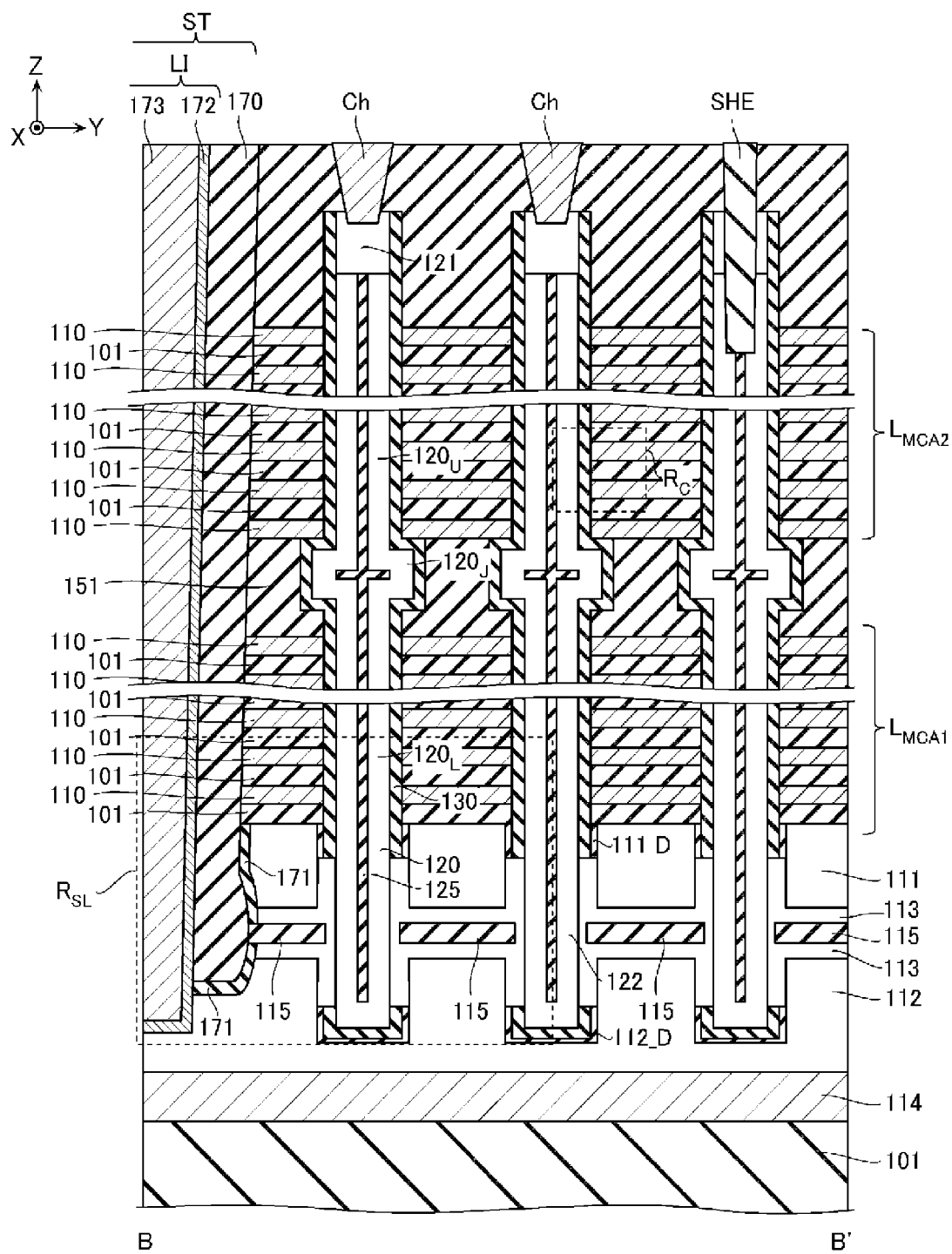
FIG. 5 is a schematic cross-sectional view illustrating a configuration of a portion of the same semiconductor storage device.
Figure 6:
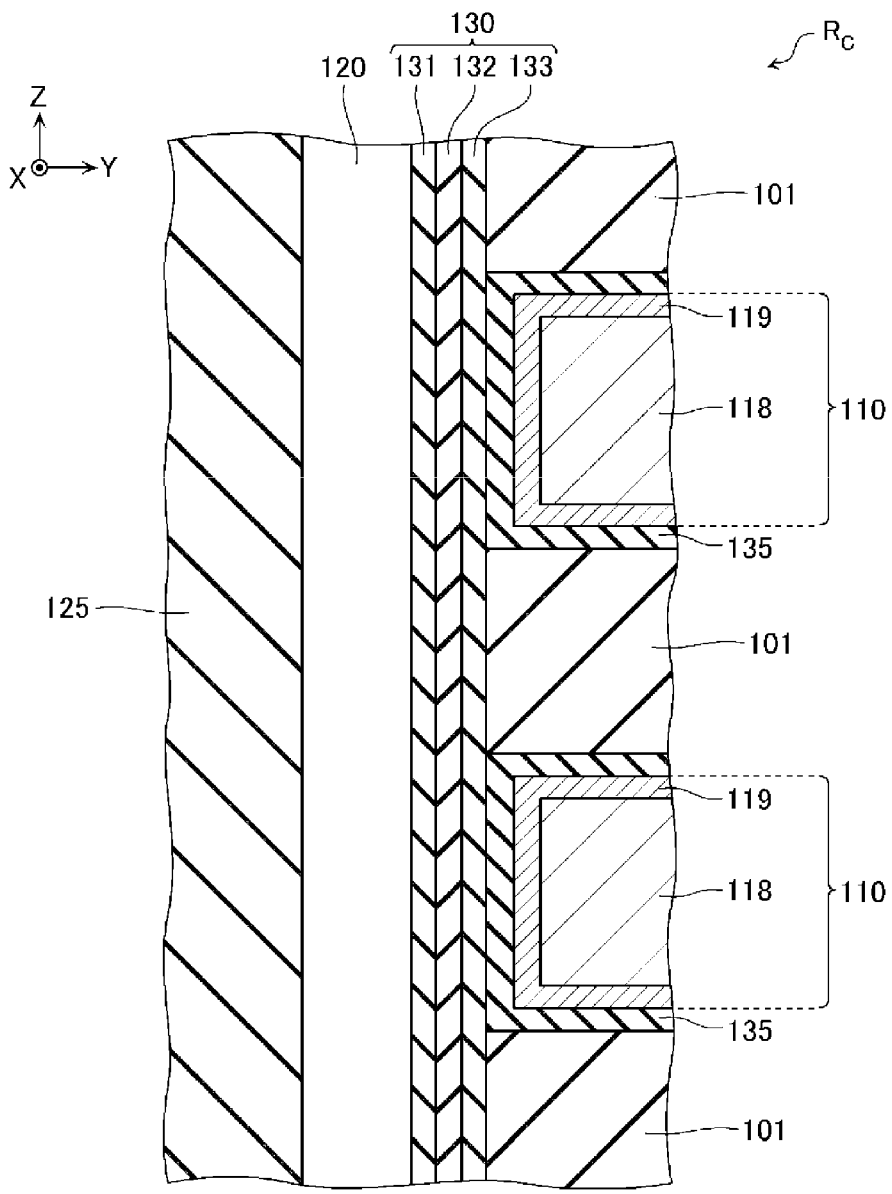
FIG. 6 is a schematic cross-sectional view illustrating a configuration of a portion of the same semiconductor storage device.

FIG. 3 is a schematic perspective view illustrating a configuration of a portion of the semiconductor storage device according to the first embodiment. FIG. 4 is a schematic plan view illustrating a configuration of a portion of the semiconductor storage device according to the first embodiment. FIG. 5 is a schematic cross-sectional view taken by cutting the structure illustrated in FIG. 4 along the line B-B', when viewed along the direction of the arrow. FIG. 6 is a schematic cross-sectional view taken by enlarging a region $R_C$ illustrated in FIG. 5.

For example, as illustrated in FIG. 3, the semiconductor storage device according to the present embodiment includes a transistor layer $L_{TR}$ provided on the semiconductor substrate 100, and a memory cell array layer $L_{MCA}$ provided above the transistor layer $L_{TR}$.

[Structure of Transistor Layer $L_{TR}$]

For example, as illustrated in FIG. 3, a wiring layer GC is provided on the upper surface of the semiconductor substrate 100 via an insulating layer (not illustrated). The wiring layer GC includes a plurality of electrodes gc that faces the upper surface of the semiconductor substrate 100. Further, the plurality of electrodes gc in each region of the semiconductor substrate 100 and the wiring layer GC are connected to contacts CS, respectively.

The plurality of respective electrodes gc face the upper surface of the semiconductor substrate 100, and function as gate electrodes of a plurality of transistors Tr provided in the peripheral circuit PC, other-side electrodes of a plurality of capacitors, and others.

The plurality of contacts CS extend in the Z direction, and the lower ends thereof are connected to the upper surface of the semiconductor substrate 100 or the upper surfaces of the electrodes gc. An impurity region containing N-type or P-type impurities is provided at the connection portion between each contact CS and the semiconductor substrate 100. Each contact CS may include, for example, a stacked film including a barrier conductive film such as titanium nitride (TiN) or the like and a metal film such as tungsten (W) or the like.

Each of wiring layers D0, D1, and D2 includes a plurality of wires, and the plurality of wires are electrically connected to the components of at least one of the memory cell array MCA and the peripheral circuit PC. The plurality of wires may include, for example, a stacked film including a barrier conductive film such as titanium nitride (TiN) or the like and a metal film such as tungsten (W) or the like.

[Structure of Memory Cell Array Layer $L_{MCA}$]

[Structure of Memory Block BLK]

For example, as illustrated in FIGS. 3 and 4, a plurality of memory blocks BLK are arranged in the Y direction, in the memory cell array layer $L_{MCA}$.

In the example of FIG. 4, each memory block BLK includes five string units SUa to SUe provided from one side of the block in the Y direction (positive side in the Y direction in FIG. 4) to the other side of the block in the Y direction (negative side in the Y direction in FIG. 4). The plurality of string units SUa to SUe correspond to the string units SU, respectively, described above with reference to FIG. 1. An insulating layer SHE between string units such as silicon oxide ($SiO_2$) or the like is provided between two string units SU adjacent to each other in the Y direction. An inter-block structure ST is provided between two memory blocks BLK adjacent to each other in the Y direction.

As illustrated in FIGS. 3 and 5, in the memory cell array layer $L_{MCA}$, the memory block BLK includes a memory cell array layer $L_{MCA1}$ and a memory cell array layer $L_{MCA2}$ provided above the memory cell array layer $L_{MCA1}$. The memory cell array layers $L_{MCA1}$ and $L_{MCA2}$ include a plurality of conductive layers 110 arranged in the Z direction, a plurality of semiconductor layers 120 each extending in the Z direction, and a plurality of gate insulating films 130 each provided between the plurality of conductive layers 110 and each semiconductor layer 120.

Each conductive layer 110 is a substantially plate-shaped conductive layer that extends in the X direction. For example, as illustrated in FIG. 6, the conductive layer 110 may include a stacked film including a barrier conductive film 119 such as titanium nitride (TiN) or the like and a metal film 118 such as tungsten (W) or the like. Further, the conductive layer 110 may contain, for example, polycrystalline silicon (Si) or the like containing impurities such as phosphorus (P), boron (B) or the like. Further, a metal oxide film 135 may be provided on positions that surround the upper surface, the lower surface, and the side surface of the conductive layer 110. The metal oxide film 135 is, for example, a metal oxide film containing at least one of aluminum (Al), titanium (Ti), hafnium (Hf), and zirconium (Zr). Contacts CC (FIG. 3) are provided at the ends of the plurality of conductive layers 110 in the X direction, respectively. Insulating layers 101 such as silicon oxide ($SiO_2$) or the like are provided among the plurality of conductive layers 110 arranged in the Z direction.

For example, as illustrated in FIG. 5, a semiconductor layer 111, a semiconductor layer 113, an insulating layer 115, and a semiconductor layer 112 are provided via an insulating layer 101 below the plurality of conductive layers 110. A conductive layer 114 may be provided on the lower surface of the semiconductor layer 112.

The semiconductor layer 111, the semiconductor layer 113, the semiconductor layer 112, and the conductive layer 114 function as the source line SL (FIG. 1). For example, the source line SL is provided in common for all of the memory blocks BLK in the memory cell array region $R_{MCA}$ (FIG. 2). The semiconductor layers 111, 113, and 112 contain, for example, polycrystalline silicon (Si) or the like containing impurities such as phosphorus (P), boron (B) or the like. The conductive layer 114 may include, for example, a metal such as tungsten (W) or the like, a conductive layer such as tungsten silicide or the like, or another conductive layer. Meanwhile, the details of the structure of a region $R_{SL}$ (FIG. 5) where the semiconductor layer 111, the semiconductor layer 113, the insulating layer 115, the semiconductor layer 112 and others are provided will be described later.

Among the plurality of conductive layers 110, the lowermost conductive layer 110 functions as the source-side select gate line SGS (FIG. 1) and the gate electrodes of the plurality of source-side select transistors STS connected thereto (FIG. 1). The conductive layer 110 is electrically independent in each memory block BLK.

Further, the plurality of conductive layers 110 above the lowermost conductive layer 110 function as the word lines WL (FIG. 1) and the gate electrodes of the plurality of memory cells MC (FIG. 1) connected thereto. Each of the plurality of conductive layers 110 is electrically independent in each memory block BLK.

Further, one or more conductive layers 110 above the above-described conductive layers 110 function as the drain-side select gate line SGD (FIG. 1) and the gate electrodes of the plurality of drain-side select transistors STD (FIG. 1) connected thereto. The widths of the plurality of conductive layers 110 in the Y direction are smaller than those of other conductive layers 110 in the Y direction. Further, the insulating layer SHE between string units is provided between two conductive layers 110 adjacent to each other in the Y direction. Each of the plurality of conductive layers 110 is electrically independent in each string unit SU.

For example, as illustrated in FIGS. 3 and 4, the semiconductor layers 120 are arranged in the X and Y directions in a predetermined pattern. The semiconductor layers 120 function as channel regions of the plurality of memory cells MC and the select transistors STD and STS in one memory string MS (FIG. 1). Each semiconductor layer 120 is, for example, a semiconductor layer such as polycrystalline silicon (Si) or the like. For example, as illustrated in FIG. 3, each semiconductor layer 120 has a substantially bottomed cylindrical shape, and an insulating layer 125 such as silicon oxide ($SiO_2$) or the like is provided in the center of the semiconductor layer 120.

As illustrated in FIG. 5, each semiconductor layer 120 includes a semiconductor region $120_L$, provided in the memory cell array layer $L_{MCA1}$ and a semiconductor region $120_U$ provided in the memory cell array layer $L_{MCA2}$. Further, the semiconductor layer 120 includes a semiconductor region $120_J$ connected to the upper end of the semiconductor region $120_L$, and the lower end of the semiconductor region $120_U$, an impurity region 122 connected to the lower end of the semiconductor region $120_L$, and an impurity region 121 connected to the upper end of the semiconductor region $120_U$.

The semiconductor region $120_L$, is a substantially cylindrical region that extends in the Z direction. The outer peripheral surface of the semiconductor region $120_L$, is surrounded by the plurality of conductive layers 110 provided in the memory cell array layer $L_{MCA1}$, and faces the plurality of conductive layers 110. Meanwhile, the radial width of the lower end of the semiconductor region $120_L$, (e.g., the portion below the plurality of conductive layers 110 provided in the memory cell array layer $L_{MCA1}$) is smaller than the radial width of the upper end of the semiconductor region $120_L$, (e.g., the portion above the plurality of conductive layers 110 provided in the memory cell array layer $L_{MCA1}$).

The semiconductor region $120_U$ is a substantially cylindrical region that extends in the Z direction. The outer peripheral surface of the semiconductor region $120_U$ is surrounded by the plurality of conductive layers 110 provided in the memory cell array layer $L_{MCA2}$, and faces the plurality of conductive layers 110. Meanwhile, the radial width of the lower end of the semiconductor region $120_U$ (e.g., the portion below the plurality of conductive layers 110 provided in the memory cell array layer $L_{MCA2}$) is smaller than the radial width of the upper end of the semiconductor region $120_U$ (e.g., the portion above the plurality of conductive layers 110 provided in the memory cell array layer $L_{MCA2}$).

The semiconductor region $120_J$ is provided above the plurality of conductive layers 110 provided in the memory cell array layer $L_{MCA1}$, and below the plurality of conductive layers 110 provided in the memory cell array layer $L_{MCA2}$. Meanwhile, the radial width of the semiconductor region $120_J$ is larger than the radial width of each of the semiconductor regions $120_L$, and $120_U$.

The impurity region 122 contains, for example, N-type impurities such as phosphorus (P) or the like, or P-type impurities such as boron (B) or the like. The impurity region 122 is connected to the semiconductor layers 111 and 112 via a portion of the semiconductor layer 113.

The impurity region 121 contains, for example, N-type impurities such as phosphorus (P) or the like. The impurity region 121 is connected to a bit line BL via contacts Ch and Vy (FIG. 3).

A gate insulating film 130 has a substantially cylindrical shape that covers the outer peripheral surface of the semiconductor layer 120. For example, as illustrated in FIG. 6, the gate insulating film 130 includes a tunnel insulating film 131, a charge storage film 132, and a block insulating film 133 which are stacked between the semiconductor layer 120 and the conductive layers 110. The tunnel insulating film 131 and the block insulating film 133 are, for example, each an insulting film such as silicon oxide ($SiO_2$) or the like. The charge storage film 132 is a film capable of storing charges such as, for example, silicon nitride (SiN). The tunnel insulating film 131, the charge storage film 132, and the block insulating film 133 each have a substantially cylindrical shape, and extend in the Z direction along the outer peripheral surface of the semiconductor layer 120.

Meanwhile, the gate insulating film 130 may include, for example, a floating gate such as polycrystalline silicon (Si) or the like containing N-type or P-type impurities.

[Structure of Inter-Block Structure ST]

The inter-block structure ST extends in the Z and X directions, divides the plurality of insulating layers 101, the plurality of conductive layers 110, the semiconductor layer 111, and the semiconductor layer 113 in the Y direction to reach the semiconductor layer 112. For example, as illustrated in FIG. 5, the inter-block structure ST includes a conductive layer LI and an insulating layer 170. The conductive layer LI includes a barrier conductive layer 172 such as titanium nitride (TiN) or the like, and a conductive layer 173 such as tungsten (W) or the like. The lower end of the conductive layer LI is connected to the semiconductor layer 112. The insulating layer 170 is provided between the conductive layer LI and the plurality of conductive layers 110. The insulating layer 170 includes, for example, silicon oxide ($SiO_2$) or the like.

[Structure of Region $R_{SL}$]

Figure 7:
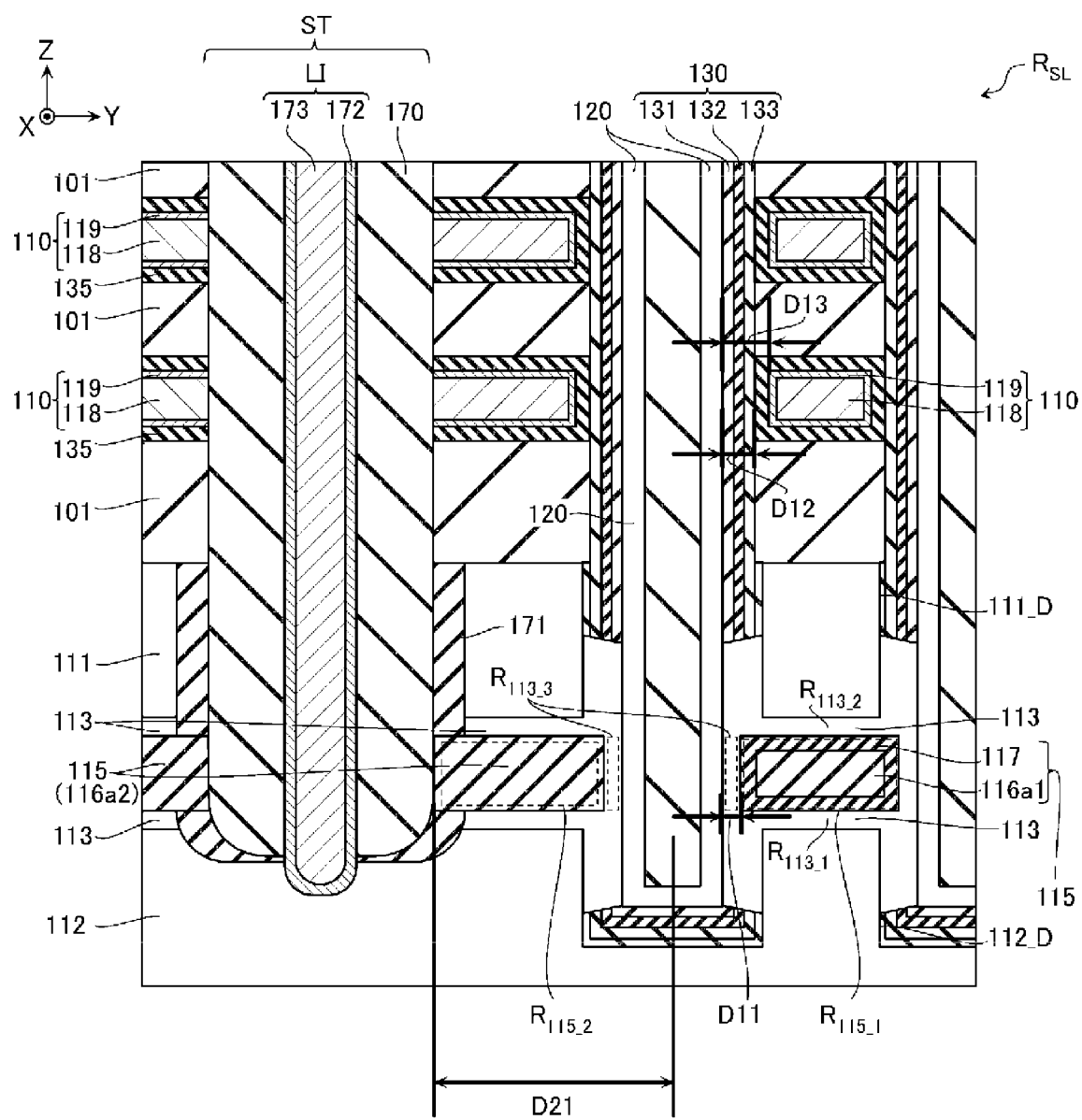
FIG. 7 is a schematic cross-sectional view illustrating a configuration of a portion of the same semiconductor storage device.

Next, the details of the structure in the region $R_{SL}$, will be described. FIG. 7 is an enlarged schematic cross-sectional view illustrating the region $R_{SL}$, illustrated in FIG. 5.

[Semiconductor Layers 111, 112, and 113]

The semiconductor layer 111 is connected to the lower end of the semiconductor layer 120 via the semiconductor layer 113 provided on the lower surface and a portion of the side surface of the semiconductor layer 111. Further, a portion of the gate insulating film 130 is provided between the semiconductor layers 111 and 120.

The semiconductor layer 112 is connected to the lower end of the semiconductor layer 120 via the semiconductor layer 113 provided on the upper surface and a portion of the side surface of the semiconductor layer 112. Further, a portion of the gate insulating film 130 is provided between the semiconductor layers 112 and 120.

The semiconductor layer 113 includes a region $R_{113\_1}$ provided on the upper surface of the semiconductor layer 112 and a region $R_{113\_2}$ provided on the lower surface of the semiconductor layer 111. Further, the semiconductor layer 113 includes a region $R_{113\_3}$ provided between the semiconductor layer 120 and the insulating layer 115, in the portion provided on the side surface of the lower end of the semiconductor layer 120.

For example, the radial width of the region $R_{113\_3}$, that is, the distance between the insulating layer 115 and the semiconductor layer 120 is defined as a width D11 (FIG. 7). Further, for example, the distance between the metal oxide film 135 and the semiconductor layer 120 is defined as a width D12 (FIG. 7). The width D11 may be smaller than the width D12. Further, for example, the distance between the conductive layer 110 and the semiconductor layer 120 is defined as a width D13 (FIG. 7). The width D11 may be smaller than the width D13.

[Insulating Layer 115]

For example, as illustrated in FIG. 7, the insulating layer 115 is provided between the regions $R_{113\_1}$ and $R_{113\_2}$ of the semiconductor layer 113. The insulating layer 115 includes a region $R_{115\_1}$ of which the distance from the inter-block structure ST is larger than the distance D21 (FIG. 7), and a region $R_{115\_2}$ of which the distance from the inter-block structure ST is smaller than the distance D21.

The region $R_{115\_1}$ is provided with an insulating layer 116a1 and a nitride film 117 covering at least a portion of the upper surface, the lower surface, and the side surface of the insulating layer 116a1. The insulating layer 116a1 is, for example, silicon oxide ($SiO_2$) or the like. The nitride film 117 is, for example, a film containing nitrogen (N) such as silicon nitride (SiN), silicon oxynitride (SiON) or the like.

Meanwhile, the nitride film 117 may include a portion that is in contact with the region $R_{113\_1}$ of the semiconductor layer 113, and extends in the X and Y directions along the region $R_{113\_1}$. Further, the nitride film 117 may include a portion that is in contact with the region $R_{113\_2}$ of the semiconductor layer 113, and extends in the X and Y directions along the region $R_{113\_2}$. Further, the nitride film 117 may include a portion that is in contact with the region $R_{113\_3}$ of the semiconductor layer 113, and extends in the Z direction along the region $R_{113\_3}$.

In the region $R_{115\_2}$, for example, an insulating layer 116a2 such as silicon oxide ($SiO_2$) or the like is provided, and a nitride film containing nitrogen (N) is not provided.

Further, the insulating layer 115 may contain at least one element of phosphorus (P) and arsenic (As). Further, the concentration of the element in the insulating layer 115 may be larger than the concentration of the element in, for example, the insulating layer 101.

Meanwhile, the concentrations of nitrogen (N), boron (B), phosphorus (P), arsenic (As) and others in each region may be measured by an EDS (energy dispersive X-ray spectrometer) or the like.

[Manufacturing Method]

Next, a manufacturing method of a semiconductor storage device according to the first embodiment will be described with reference to FIGS. 8 to 31. FIGS. 8 to 23 and 28 to 31 are schematic cross-sectional views illustrating the same manufacturing method, and represent the cross section corresponding to FIG. 5. FIGS. 24 to 27 are schematic cross-sectional views illustrating the same manufacturing method, and represent the cross section corresponding to FIG. 7.

In the manufacturing method of the semiconductor storage device according to the first embodiment, first, the peripheral circuit PC (FIG. 1) is formed on the semiconductor substrate 100. Further, the insulating layer 101 is formed above the peripheral circuit PC.

Figure 8:
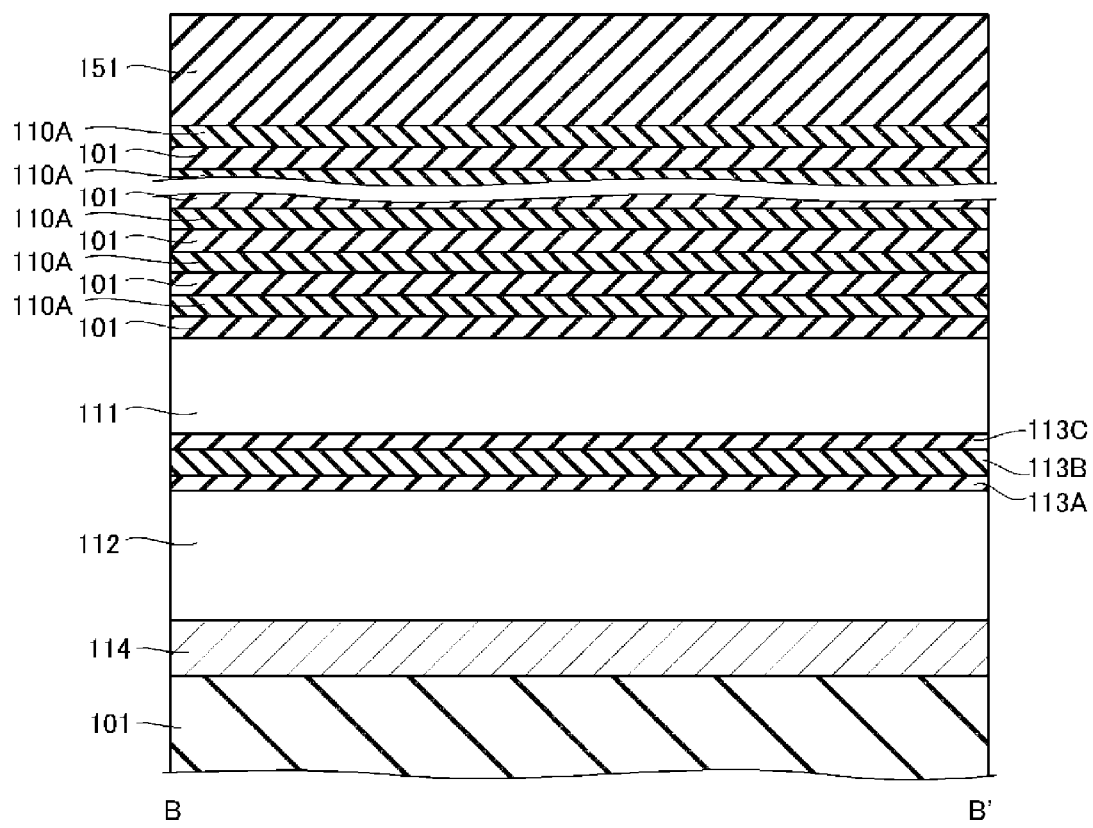
FIG. 8 is a schematic cross-sectional view illustrating a manufacturing method of the same semiconductor storage device.

Next, for example, as illustrated in FIG. 8, the conductive layer 114, the semiconductor layer 112, a sacrificial layer 113A such as silicon oxide ($SiO_2$) or the like, a sacrificial layer 113B such as silicon nitride (SiN) or the like, a sacrificial layer 113C such as silicon oxide ($SiO_2$) or the like, and the semiconductor layer 111 are formed on the insulating layer 101. Further, a plurality of insulating layers 101 and a plurality of sacrificial layers 110A are alternately formed, and an insulating layer 151 such as silicon oxide ($SiO_2$) or the like is formed. This step is performed by, for example, a method such as CVD (chemical vapor deposition) or the like.

Figure 9:
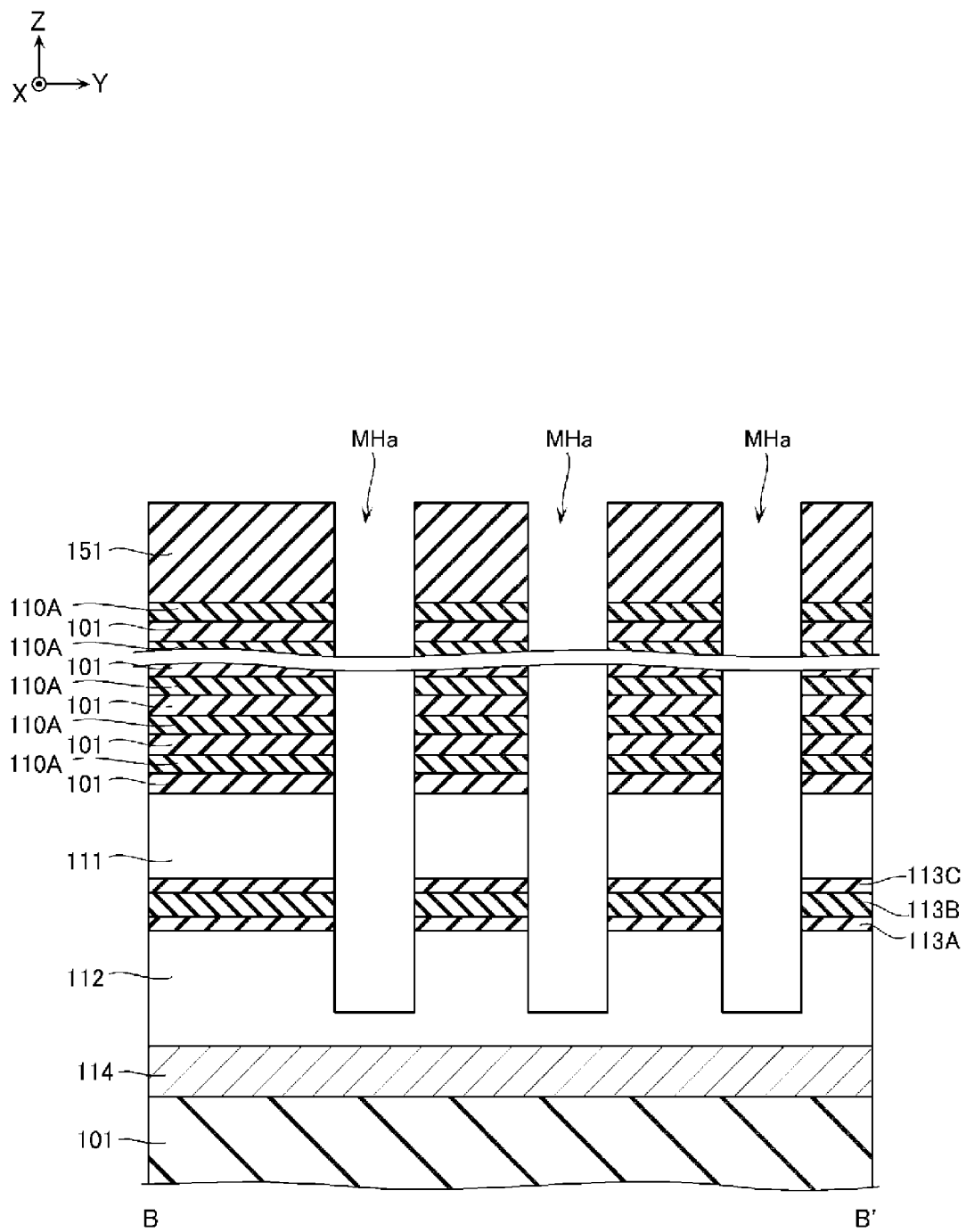
FIG. 9 is a schematic cross-sectional view illustrating a manufacturing method of the same semiconductor storage device.

Next, for example, as illustrated in FIG. 9, a plurality of openings MHa is each formed at a position corresponding to the semiconductor region $120_L$. Each opening MHa extends in the Z direction, and penetrates the insulating layer 151, the plurality of sacrificial layers 110A, the plurality of insulating layers 101, the semiconductor layer 111, the sacrificial layer 113C, the sacrificial layer 113B, and the sacrificial layer 113A, to expose the semiconductor layer 112. This step is performed by, for example, a method such as RIE or the like.

Figure 10:
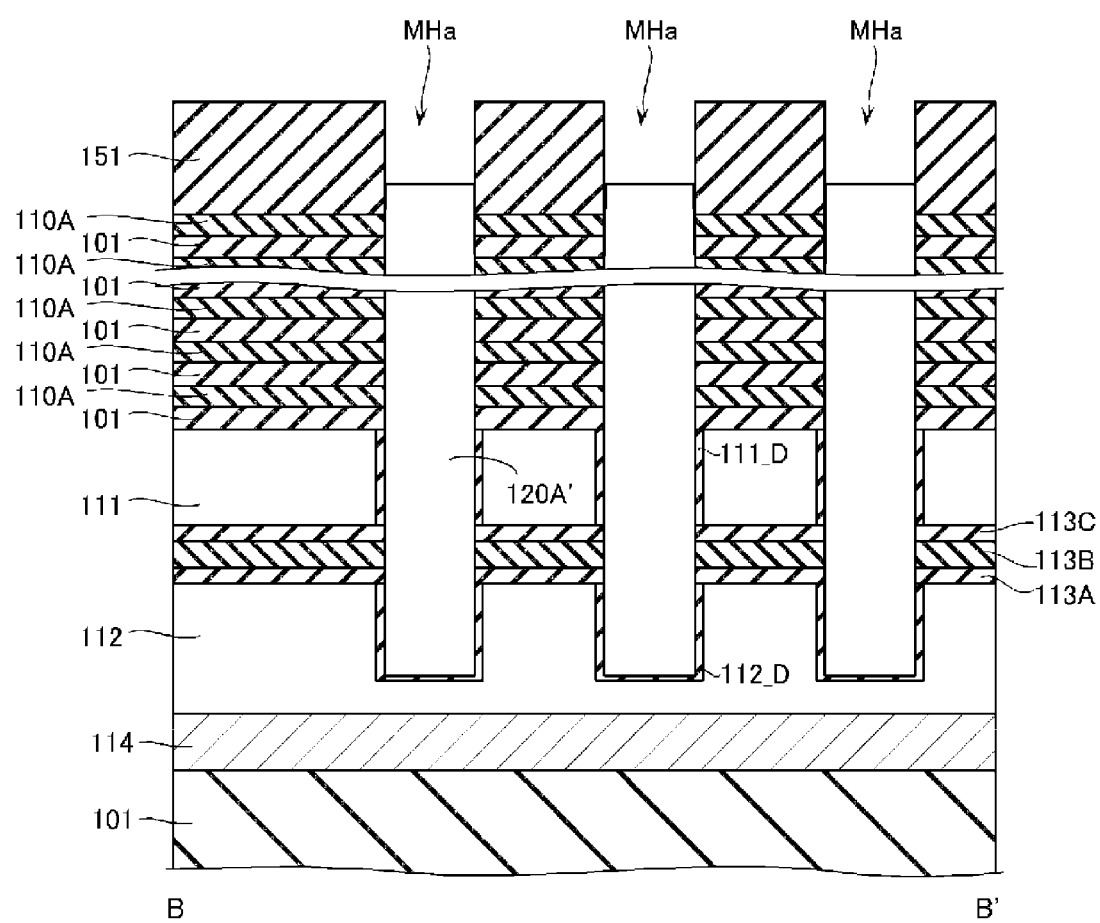
FIG. 10 is a schematic cross-sectional view illustrating a manufacturing method of the same semiconductor storage device.

Next, for example, as illustrated in FIG. 10, insulating layers 111_D and 112_D such as silicon oxide ($SiO_2$) or the like are formed on the portions of the semiconductor layers 111 and 112 that are exposed to the opening MHa, respectively. This step is performed by, for example, a thermal oxidation or the like.

Next, for example, as illustrated in FIG. 10, a sacrificial layer 120A' such as amorphous silicon (Si) or the like is formed inside the opening MHa, and the sacrificial layer 120A' is removed to a position where the upper surface of the sacrificial layer 120A' lies between the upper and lower surfaces of the insulating layer 151. This step is performed by, for example, CVD, RIE, or the like.

Figure 11:
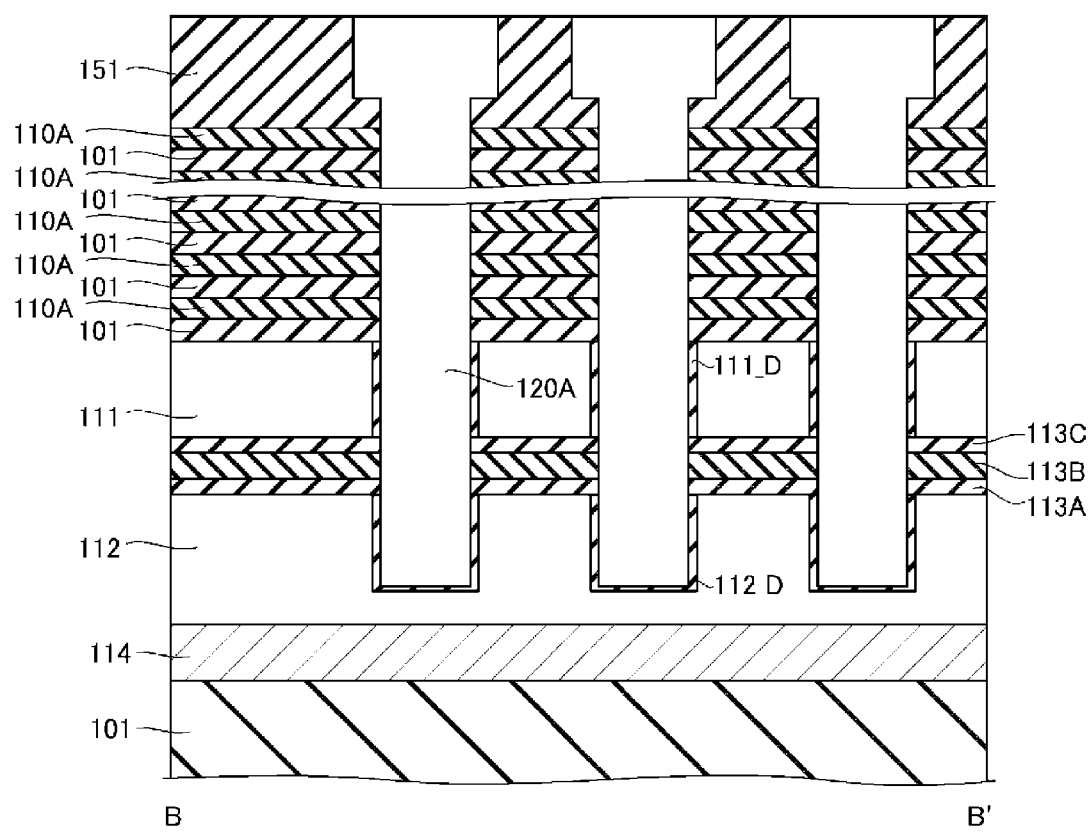
FIG. 11 is a schematic cross-sectional view illustrating a manufacturing method of the same semiconductor storage device.

Next, for example, as illustrated in FIG. 11, the opening at the upper end of the opening MHa is widened, and then, amorphous silicon (Si) or the like is formed therein, to form a sacrificial layer 120A. This step is performed by, for example, a wet etching, CVD, RIE or the like.

Figure 12:
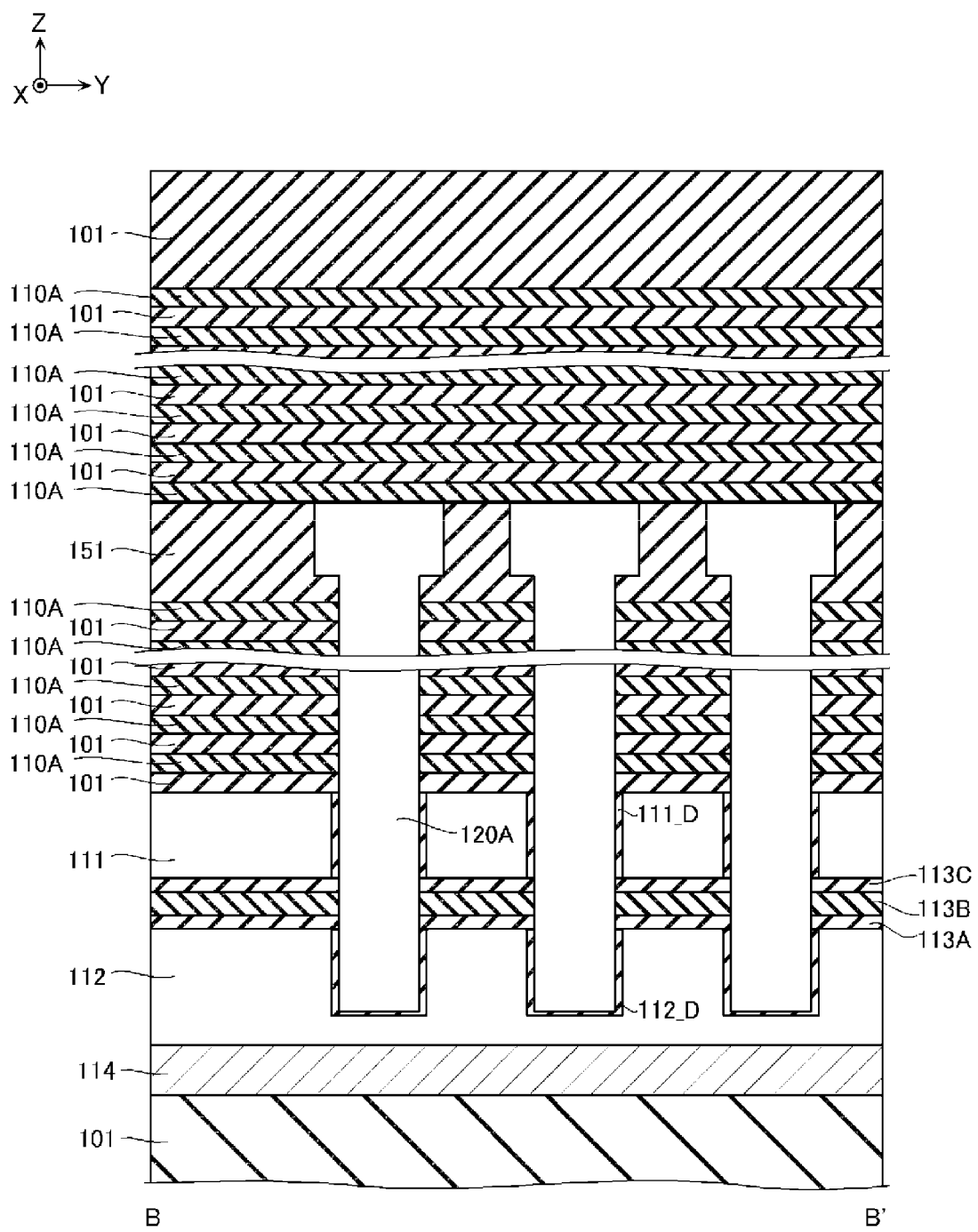
FIG. 12 is a schematic cross-sectional view illustrating a manufacturing method of the same semiconductor storage device.

Next, for example, as illustrated in FIG. 12, a plurality of sacrificial layers 110A and a plurality of insulating layers 101 are alternately formed on the insulating layer 151. This step is performed by, for example, a method such as CVD or the like.

Figure 13:
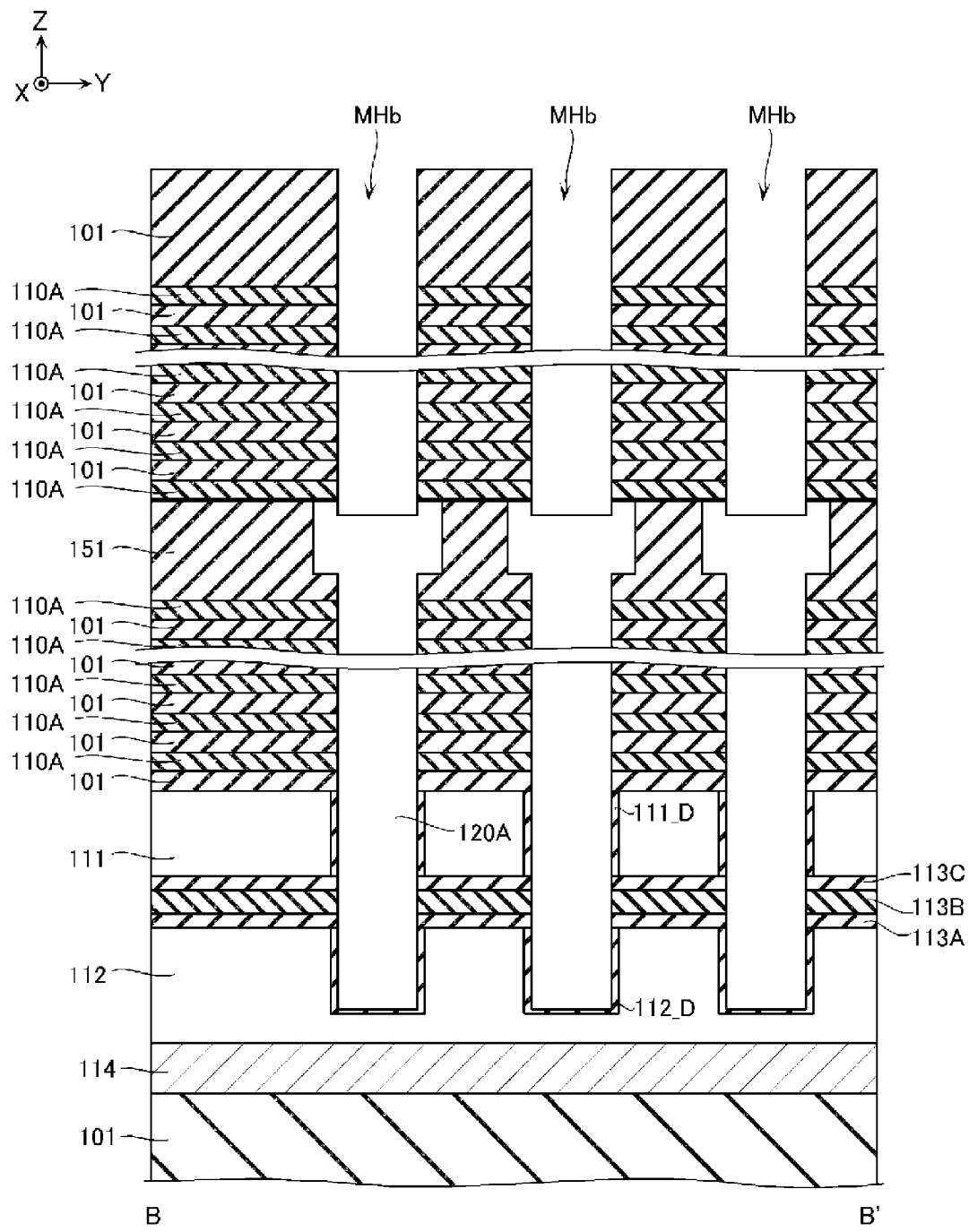
FIG. 13 is a schematic cross-sectional view illustrating a manufacturing method of the same semiconductor storage device.

Next, for example, as illustrated in FIG. 13, a plurality of openings MHb is each formed at a position corresponding to the semiconductor region $120_U$. Each opening MHb extends in the Z direction, and penetrates the plurality of sacrificial layers 110A and the plurality of insulating layers 101, to expose the sacrificial layer 120A. This step is performed by, for example, a method such as RIE or the like.

Figure 14:
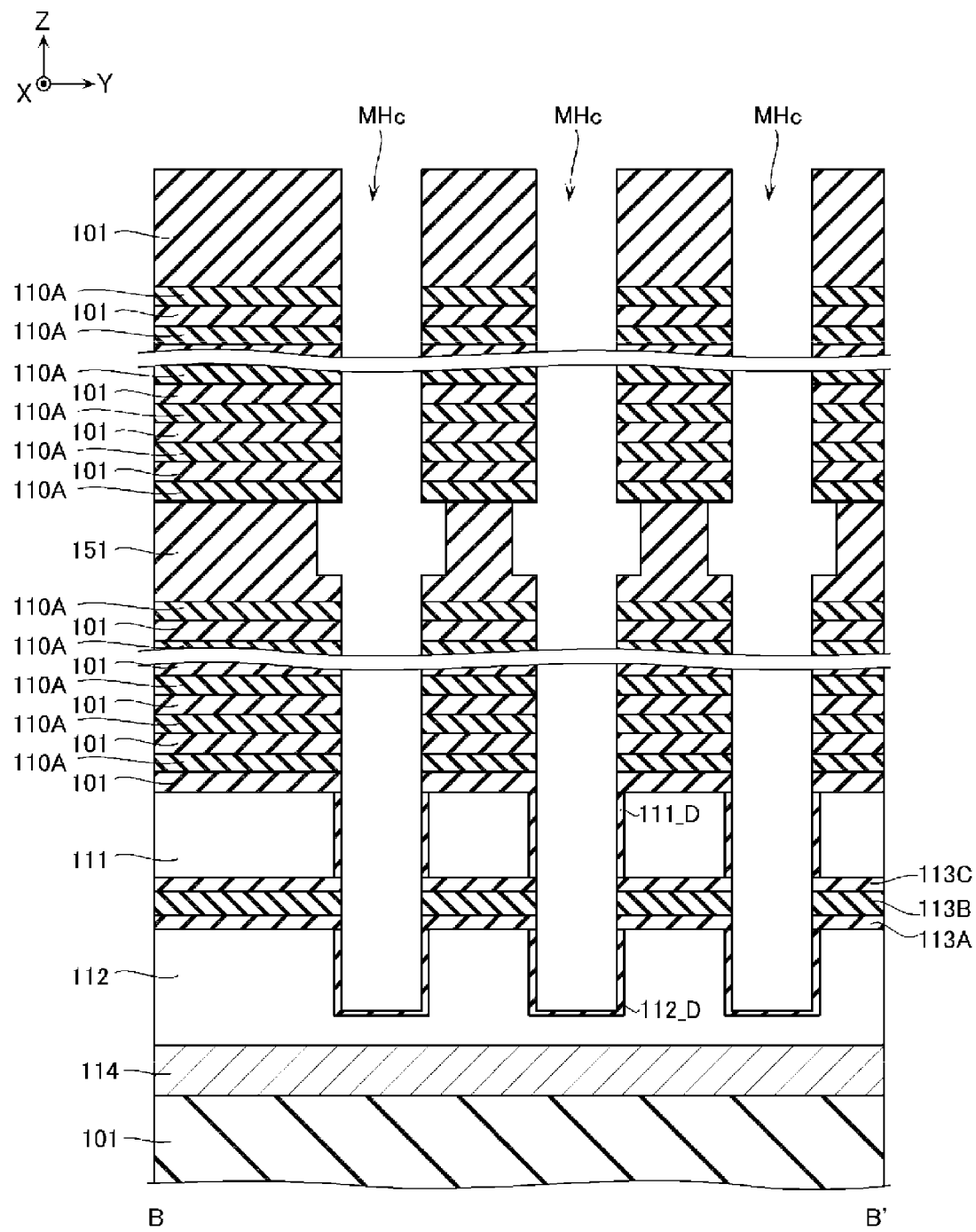
FIG. 14 is a schematic cross-sectional view illustrating a manufacturing method of the same semiconductor storage device.

Next, for example, as illustrated in FIG. 14, the sacrificial layer 120A is removed to form an opening MHc. This step is performed by, for example, a method such as a wet etching or the like. Meanwhile, the semiconductor layers 111 and 112 contain silicon (Si) or the like which is the same element as that contained in the sacrificial layer 120A. However, the semiconductor layers 111 and 112 are protected by the insulating layers 111_D and 112_D that serve as etching stoppers. Thus, the semiconductor layers 111 and 112 are not etched in this step.

Figure 15:
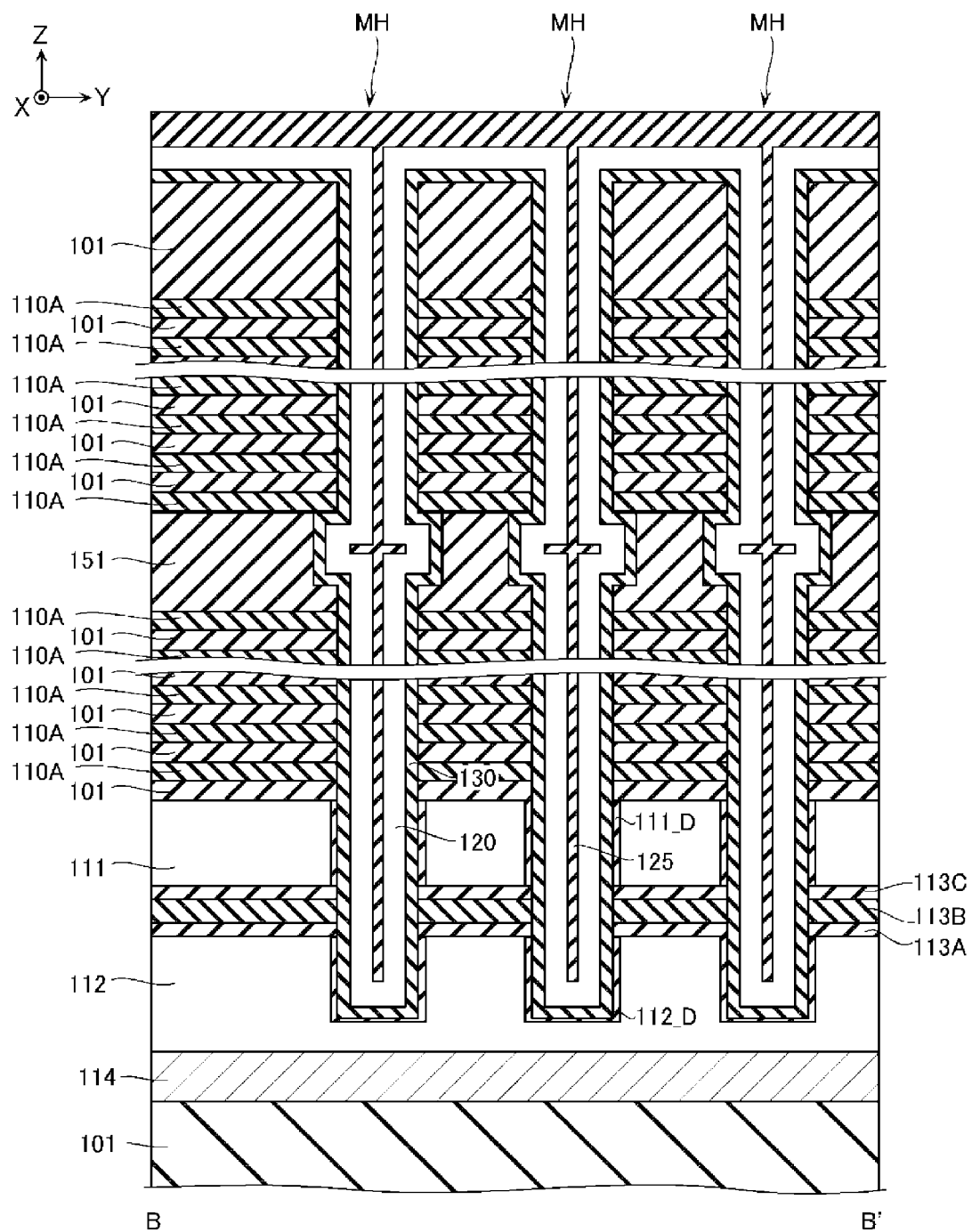
FIG. 15 is a schematic cross-sectional view illustrating a manufacturing method of the same semiconductor storage device.

Next, for example, as illustrated in FIG. 15, a gate insulating film 130, a semiconductor layer 120, and an insulating layer 125 are formed on the upper surface of the uppermost insulating layer 101 and the inner peripheral surface of the opening MHc, and a memory hole MH is formed. When the semiconductor layer 120 is formed, a film formation is performed by, for example, CVD or the like, and an amorphous silicon (Si) film is formed inside the memory hole MH. Further, the crystal structure of the amorphous silicon (Si) film is modified by, for example, an annealing process or the like.

Figure 16:
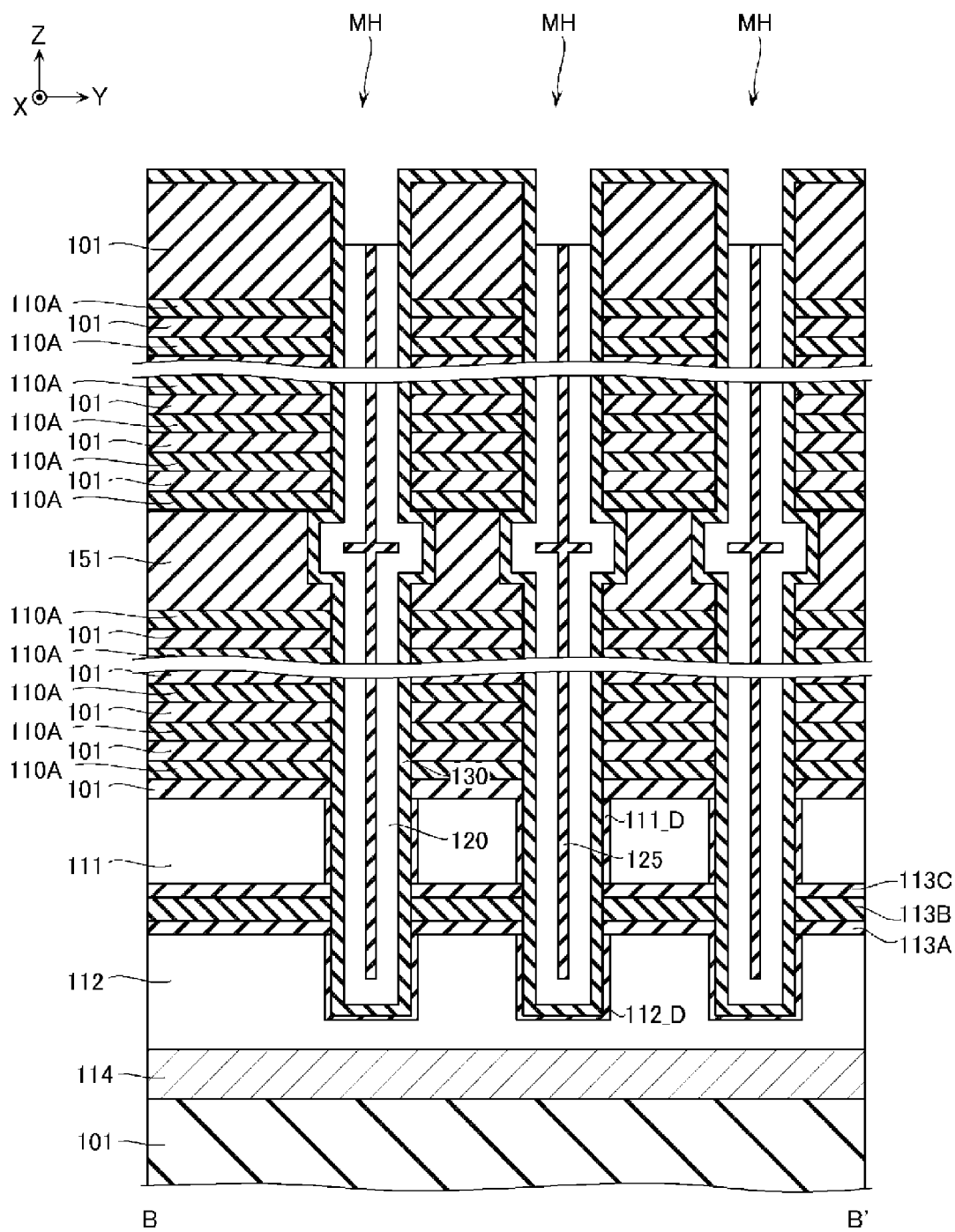
FIG. 16 is a schematic cross-sectional view illustrating a manufacturing method of the same semiconductor storage device.

Next, for example, as illustrated in FIG. 16, a portion of the insulating layer 125 and the semiconductor layer 120 is removed to a position where the upper surface of the semiconductor layer 120 and others lies between the upper and lower surfaces of the uppermost insulating layer 101. This step is performed by, for example, a method such as RIE or the like.

Figure 17:
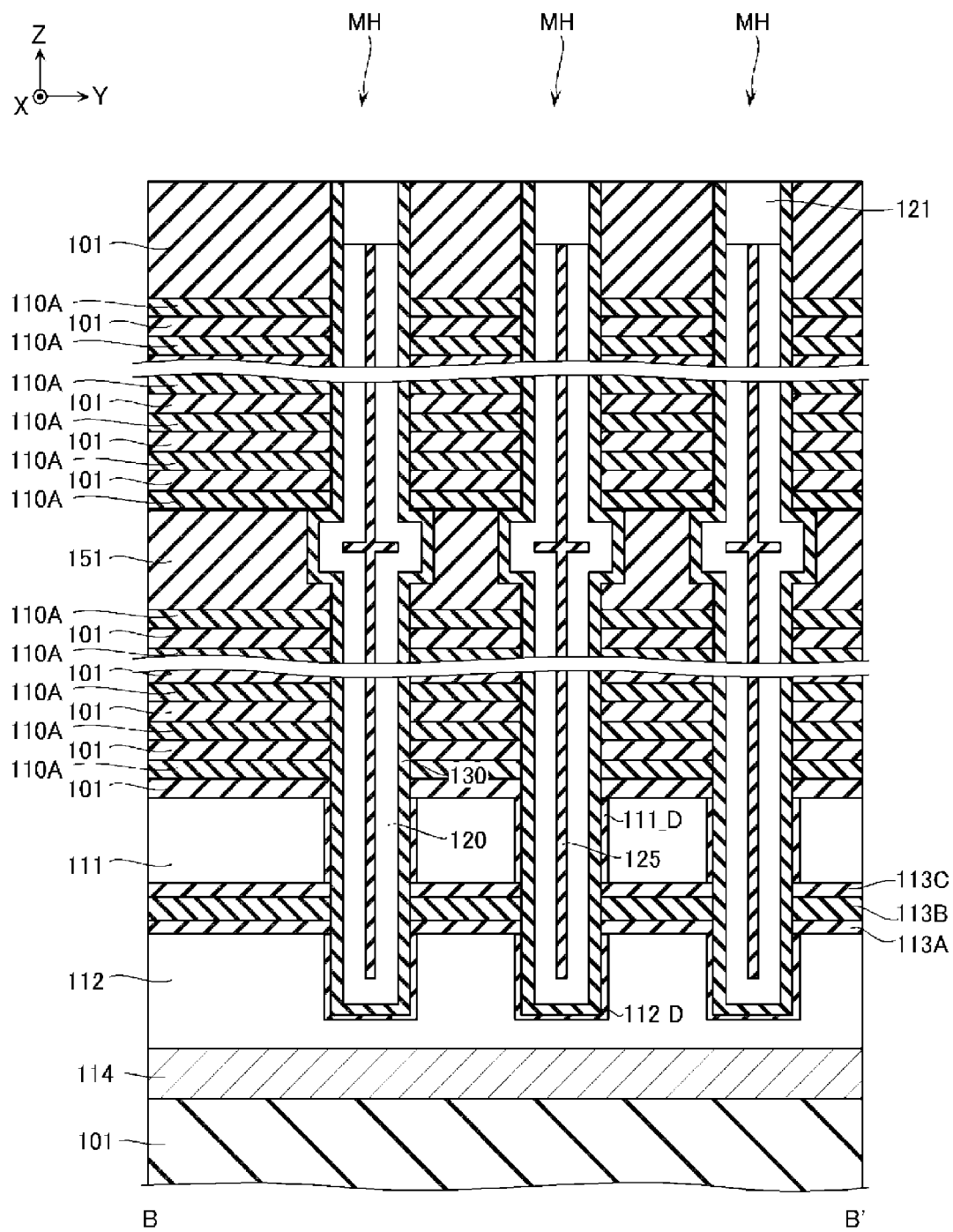
FIG. 17 is a schematic cross-sectional view illustrating a manufacturing method of the same semiconductor storage device.

Next, for example, as illustrated in FIG. 17, an impurity region 121 of the semiconductor layer 120 is formed near the upper end of the memory hole MH. This step is performed by, for example, a method such as CVD, RIE or the like.

Figure 18:
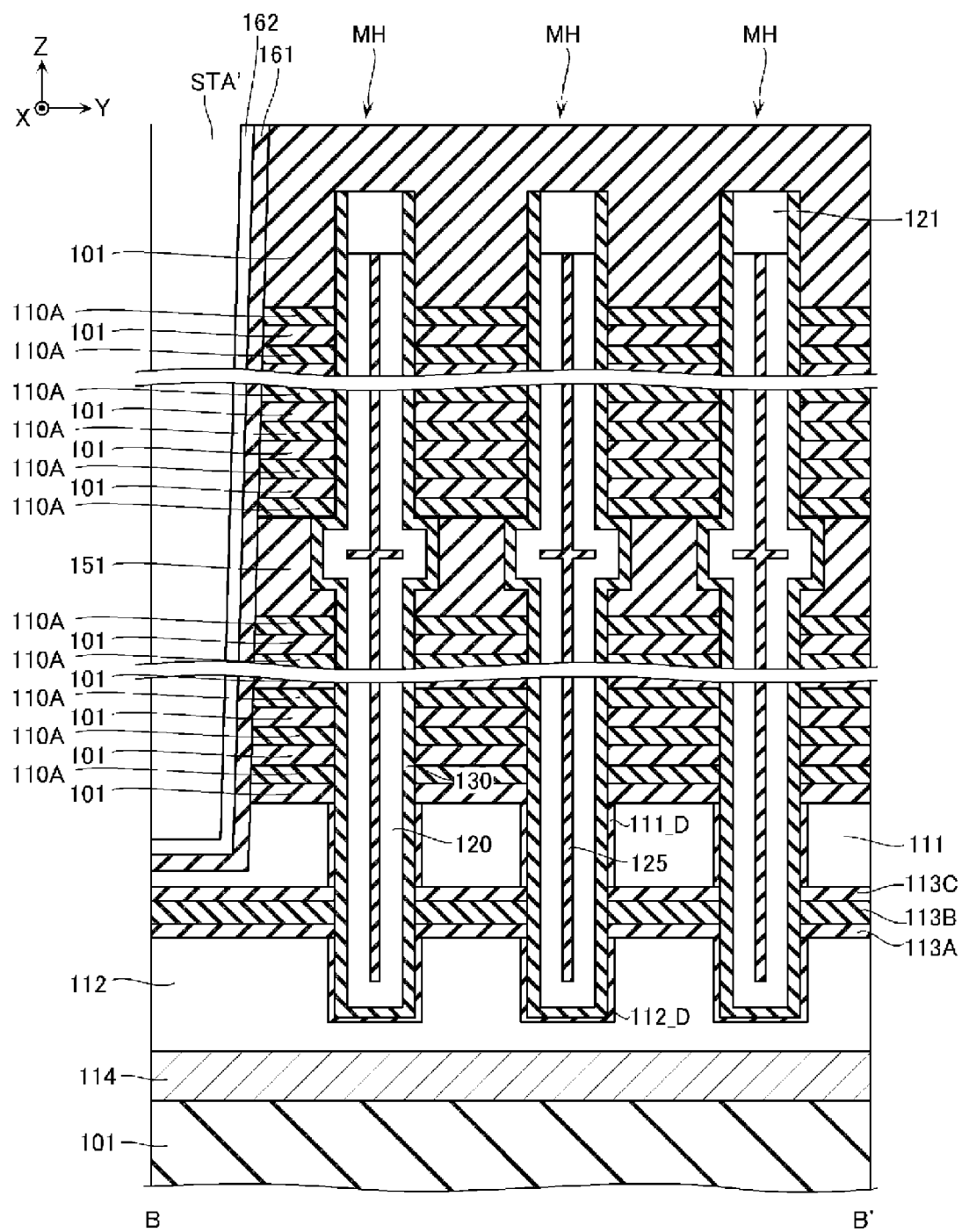
FIG. 18 is a schematic cross-sectional view illustrating a manufacturing method of the same semiconductor storage device.

Next, for example, as illustrated in FIG. 18, a trench STA' is formed. The trench STA' extends in the Z and X directions, and is formed by dividing the plurality of insulating layers 101 and the plurality of sacrificial layers 110A in the Y direction, and exposing the semiconductor layer 111. This step is performed by, for example, a method such as RIE or the like. Further, an insulating layer 161 such as silicon oxide ($SiO_2$) or the like and a semiconductor layer 162 such as amorphous silicon (Si) or the like are formed inside the trench STA' by a method such as CVD or the like.

Figure 19:
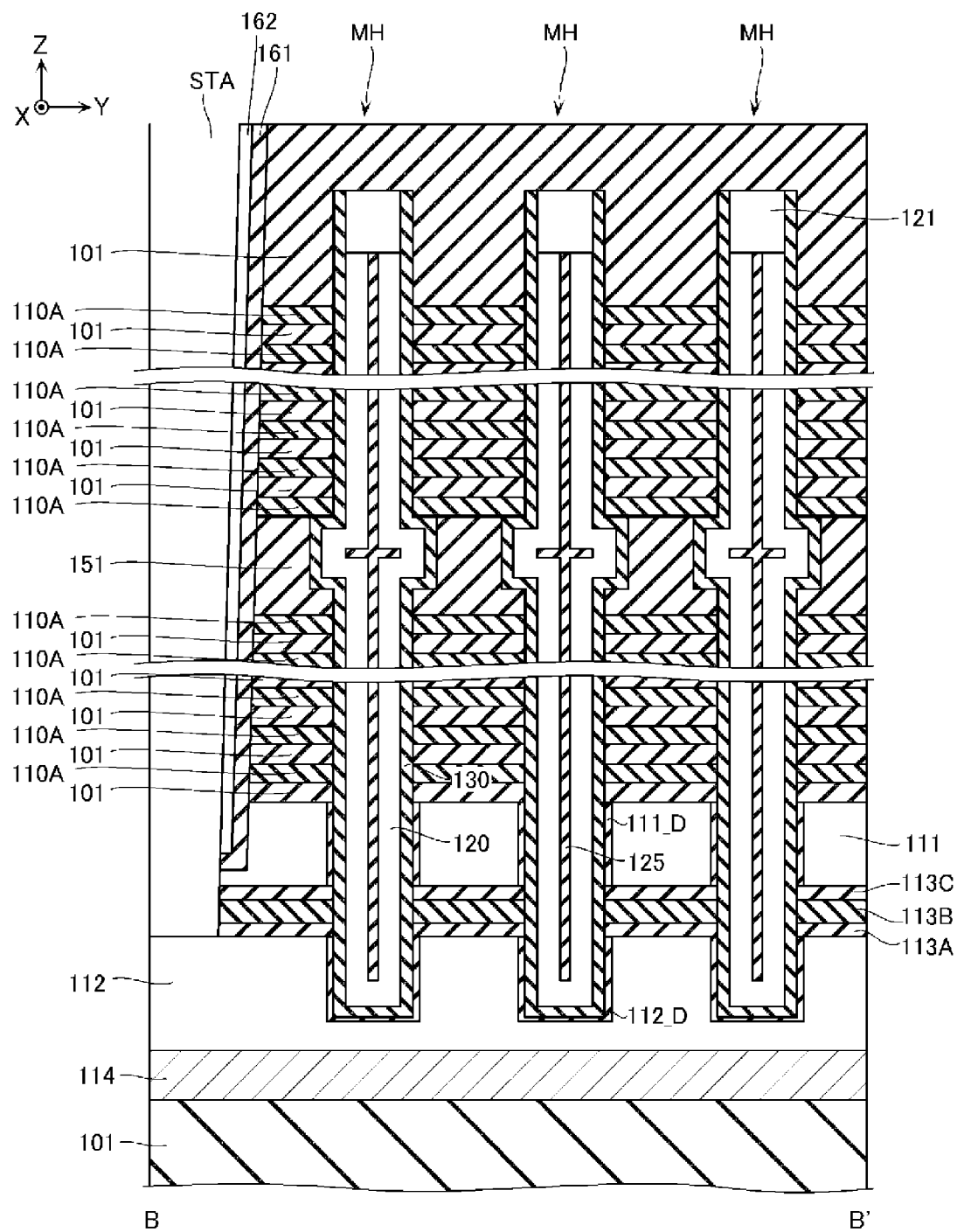
FIG. 19 is a schematic cross-sectional view illustrating a manufacturing method of the same semiconductor storage device.

Next, for example, as illustrated in FIG. 19, a trench STA is formed. The trench STA further extends from the bottom surface of the trench STA', and is formed by dividing the semiconductor layer 162, the insulating layer 161, the semiconductor layer 111, and the sacrificial layers 113C, 113B, and 113A in the Y direction, and exposing the semiconductor layer 112. This step is performed by, for example, RIE or the like.

Figure 20:
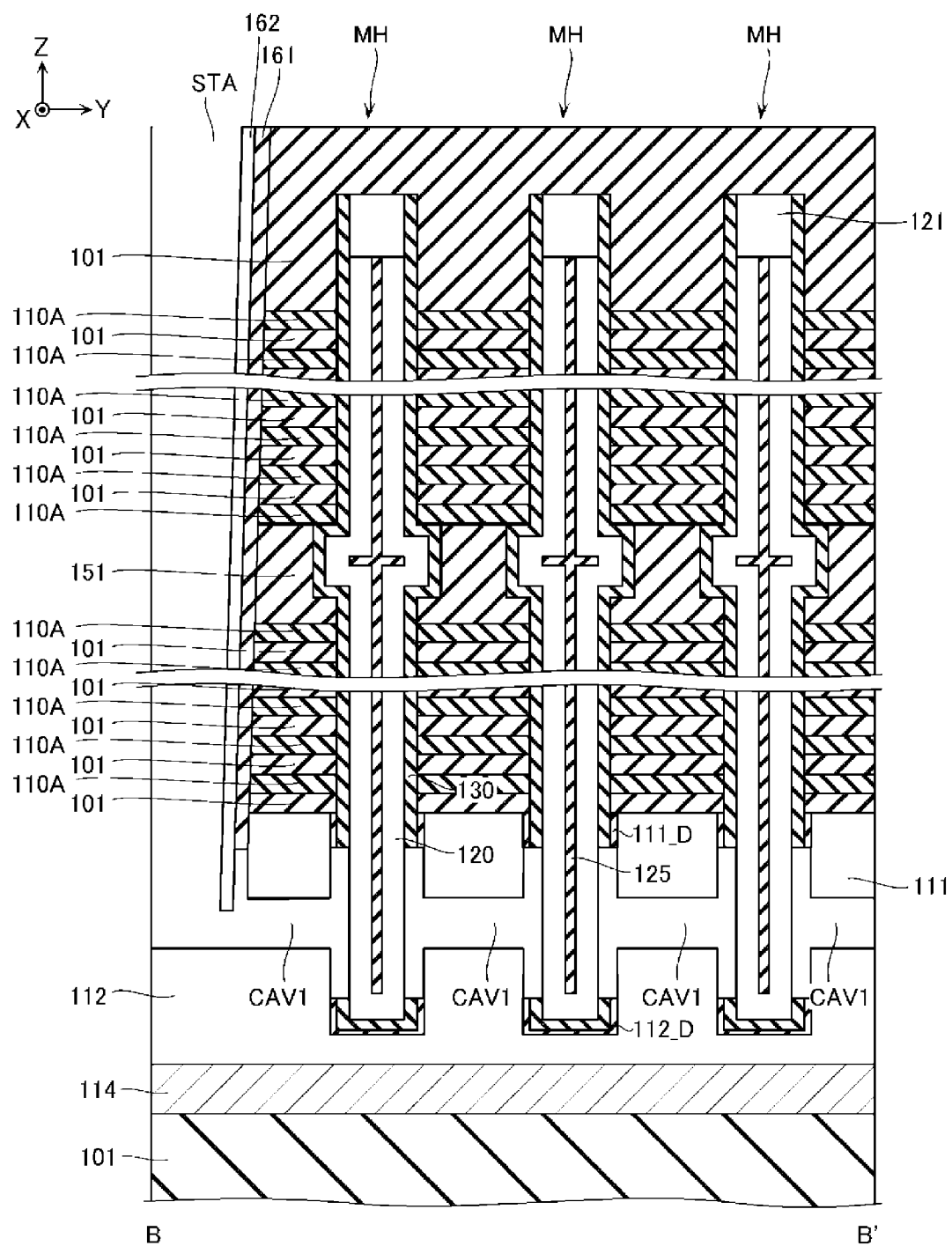
FIG. 20 is a schematic cross-sectional view illustrating a manufacturing method of the same semiconductor storage device.

Next, for example, as illustrated in FIG. 20, the sacrificial layer 113B is removed through the trench STA, and subsequently, the sacrificial layers 113A and 113C, a portion of the insulating layers 111_D and 112_D, and a portion of the gate insulating film 130 are removed to form a cavity CAV1 and expose the lower end of the semiconductor layer 120. This step is performed by, for example, a method such as a wet etching or the like.

Figure 21:
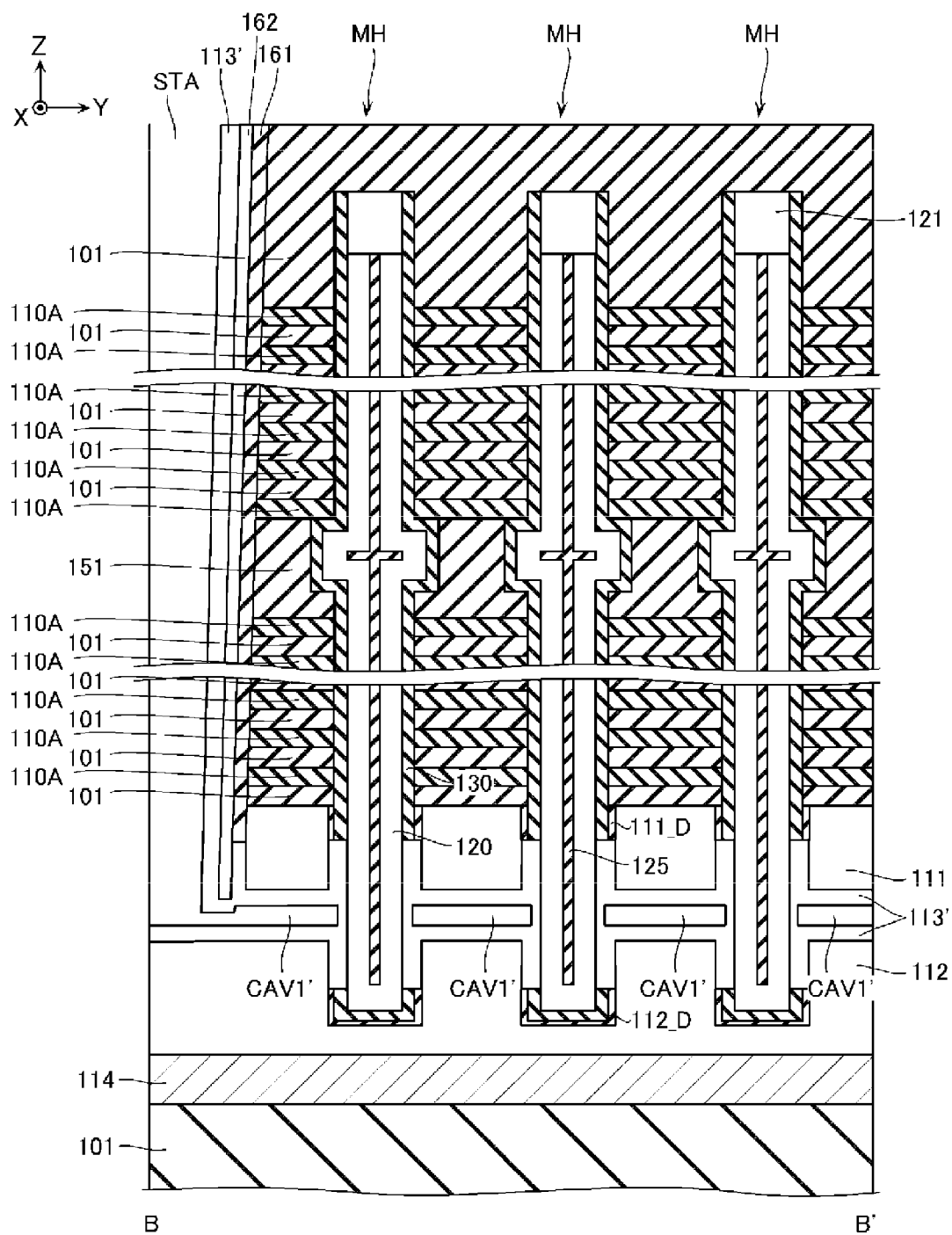
FIG. 21 is a schematic cross-sectional view illustrating a manufacturing method of the same semiconductor storage device.

Next, for example, as illustrated in FIG. 21, a semiconductor layer 113' is formed on the side surface of the trench STA in the Y direction, the lower surface of the semiconductor layer 111, the upper surface of the semiconductor layer 112, and the side surface of the lower end of the semiconductor layer 120, through the trench STA. This step is performed by, for example, a method such as CVD, an epitaxial growth or the like. Meanwhile, in this step, the semiconductor layer 113' is formed with a relatively thin film thickness in order not to fill up the entire cavity CAV1. In this step, a cavity CAV1' is formed such that the upper surface, the lower surface, and a portion of the side surface are surrounded by the semiconductor layer 113'.

Figure 22:
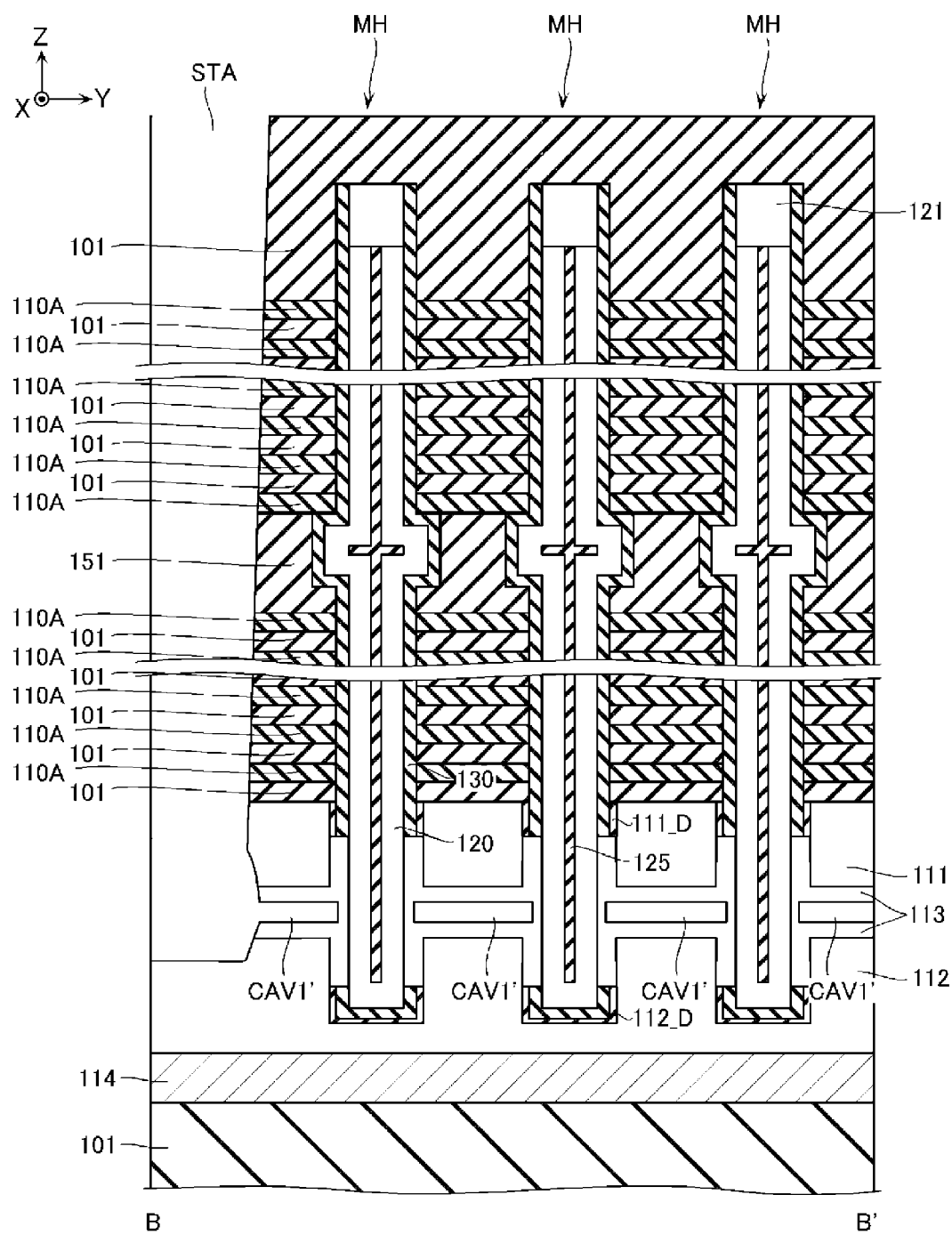
FIG. 22 is a schematic cross-sectional view illustrating a manufacturing method of the same semiconductor storage device.

Next, for example, as illustrated in FIG. 22, a portion of the semiconductor layer 113' on the side surface of the trench STA in the Y direction and the bottom surface thereof, and the semiconductor layer 162 on the side surface of the trench STA in the Y direction are removed to form a semiconductor layer 113. In this step, a portion of the semiconductor layer 112 is also removed at the same time, and the widths of the lower end of the trench STA in the Y and X direction are widened. Further, the insulating layer 161 on the side surface of the trench STA in the Y direction is removed. This step is performed by, for example, a method such as a wet etching or the like.

Figure 23:
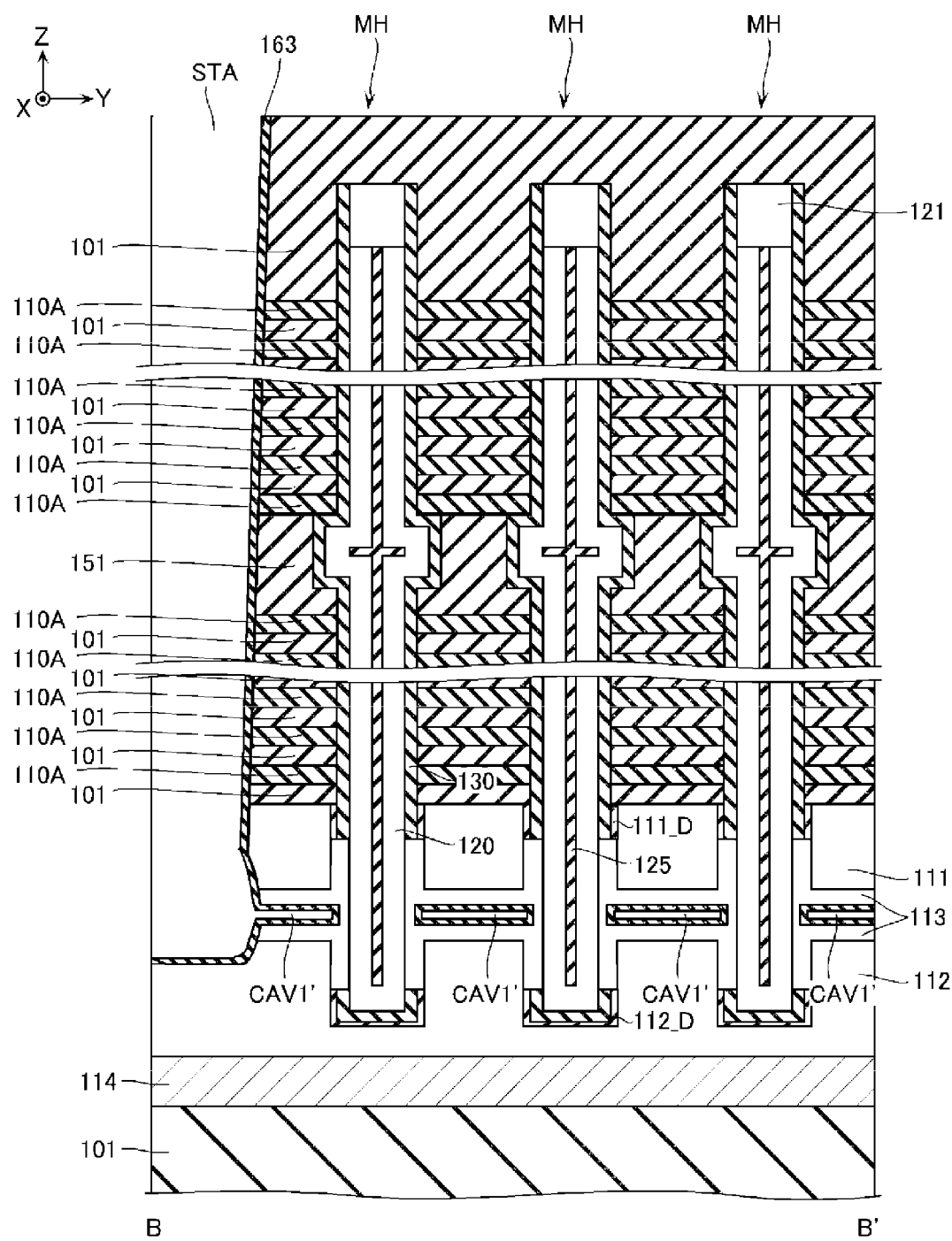
FIG. 23 is a schematic cross-sectional view illustrating a manufacturing method of the same semiconductor storage device.
Figure 24:
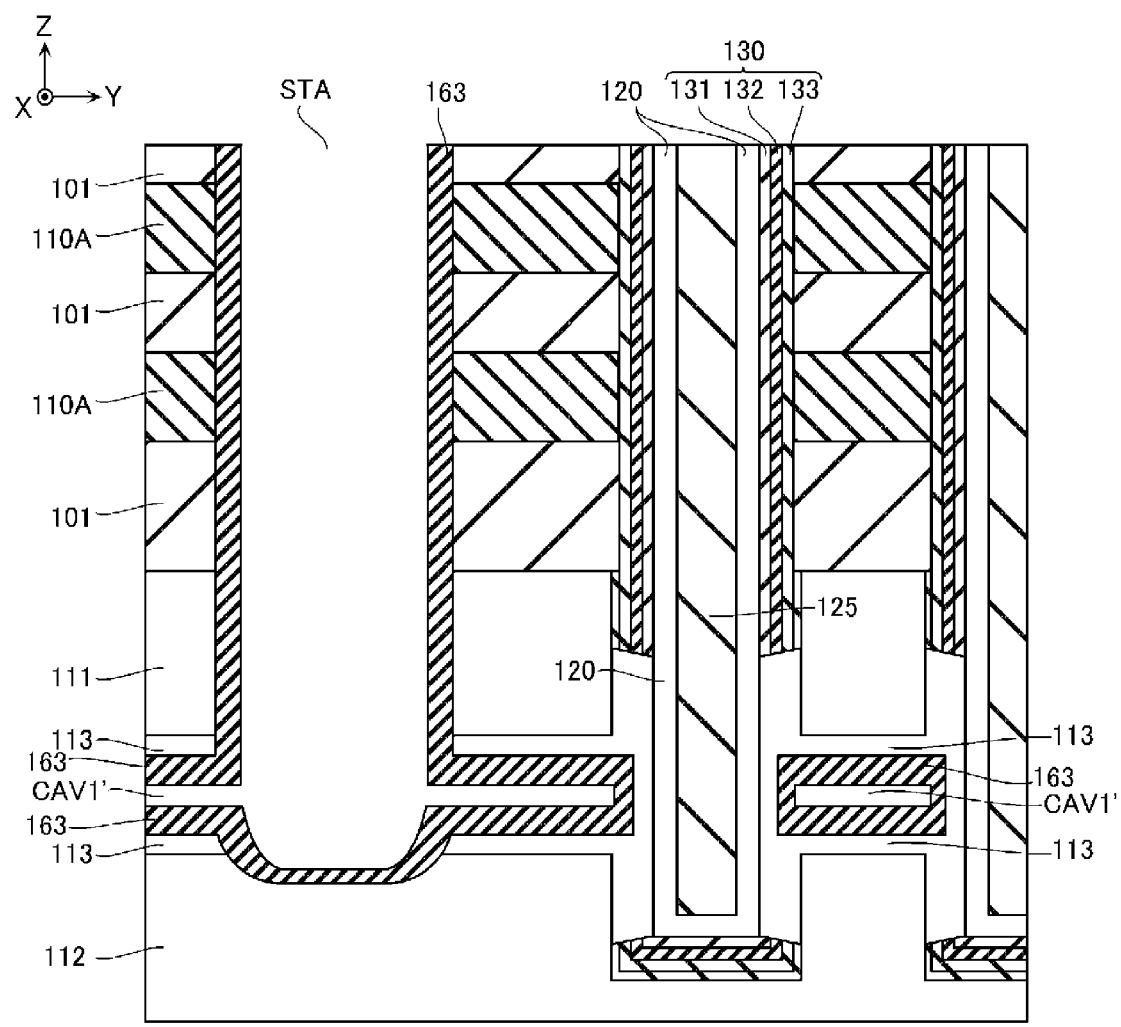
FIG. 24 is a schematic cross-sectional view illustrating a manufacturing method of the same semiconductor storage device.

Next, for example, as illustrated in FIGS. 23 and 24, a nitride film 163 is formed on the side surface of the trench STA in the Y direction and the bottom surface thereof, and the upper surface, the lower surface, and the side surface of the semiconductor layer 113 which are in contact with the cavity CAV1', through the trench STA and the cavity CAV1'. The nitride film 163 contains, for example, silicon nitride (SiN), silicon oxynitride (SiON), or the like. This step is performed by, for example, a method such as CVD or the like.

Figure 25:
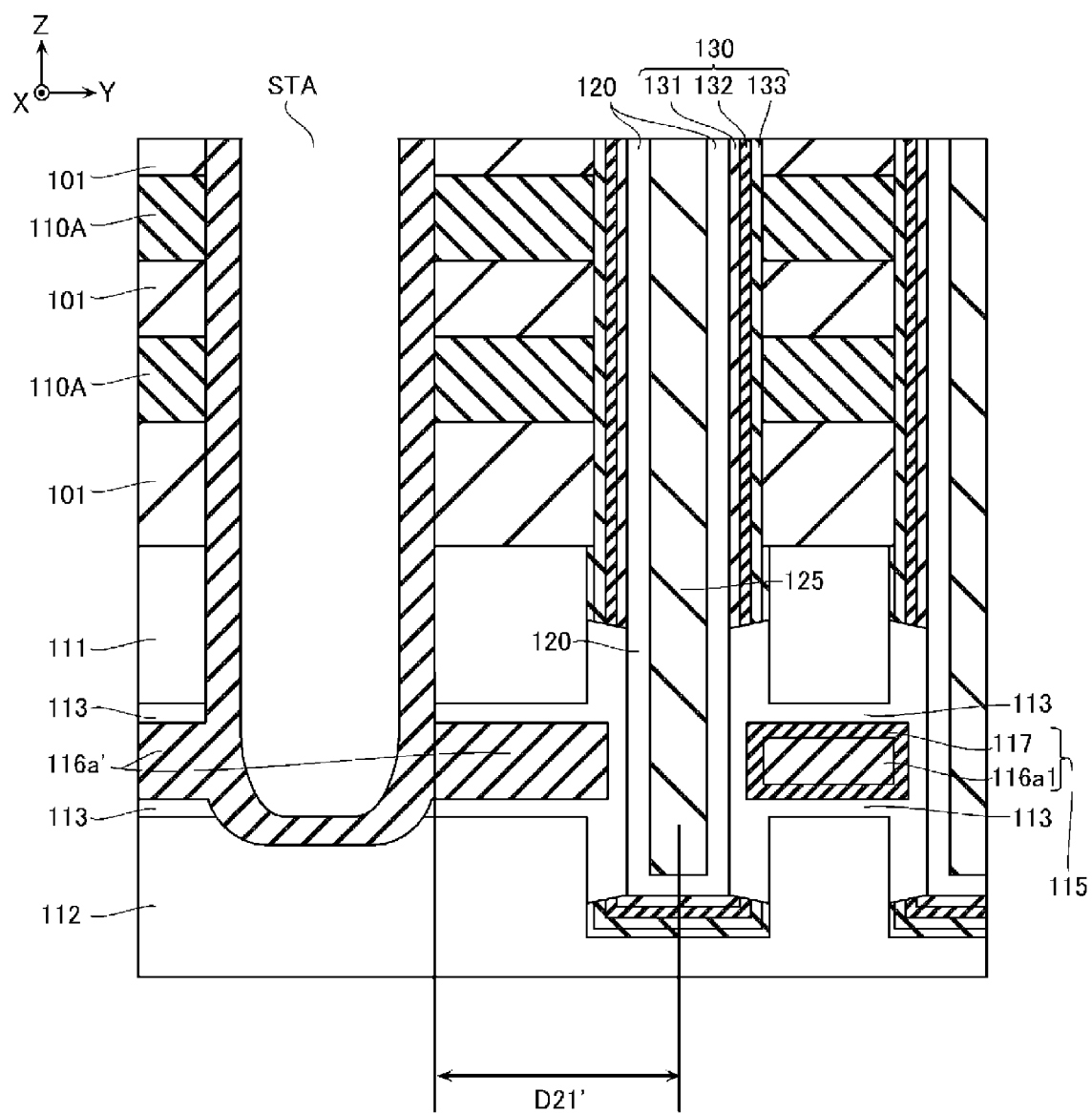
FIG. 25 is a schematic cross-sectional view illustrating a manufacturing method of the same semiconductor storage device.

Next, for example, as illustrated in FIG. 25, the nitride film 163 is oxidized through the trench STA and the cavity CAV1', and insulating layers 116a' and 116a1 such as silicon oxide ($SiO_2$) or the like are formed on the side surface of the trench STA in the Y direction and in the portion of the cavity CAV1' in the previous step. In the present step, for example, as illustrated in FIG. 25, the nitride film 163 is completely oxidized, and the insulating layer 116a' is formed, at the position where the distance from the trench STA is shorter than a distance D21'. At the position of which the distance from the trench STA is longer than the distance D21', the nitride film 163 is not completely oxidized, and only a portion of the nitride film 163 close to the cavity CAV1' is oxidized. Thus, at the position of which the distance from the trench STA is longer than the distance D21', the insulating layer 116a1 is formed in the portion where the nitride film 163 is oxidized, and the nitride film 117 is formed in the portion where the nitride film 163 is not oxidized. Meanwhile, when the nitride film 163 is oxidized, the volume of the oxidized portion increases, and thus, the portion of the cavity CAV1' in the previous step is filled with the insulating layer 116a' or 116a1. This step is performed by, for example, a method such as a plasma oxidation or the like.

Figure 26:
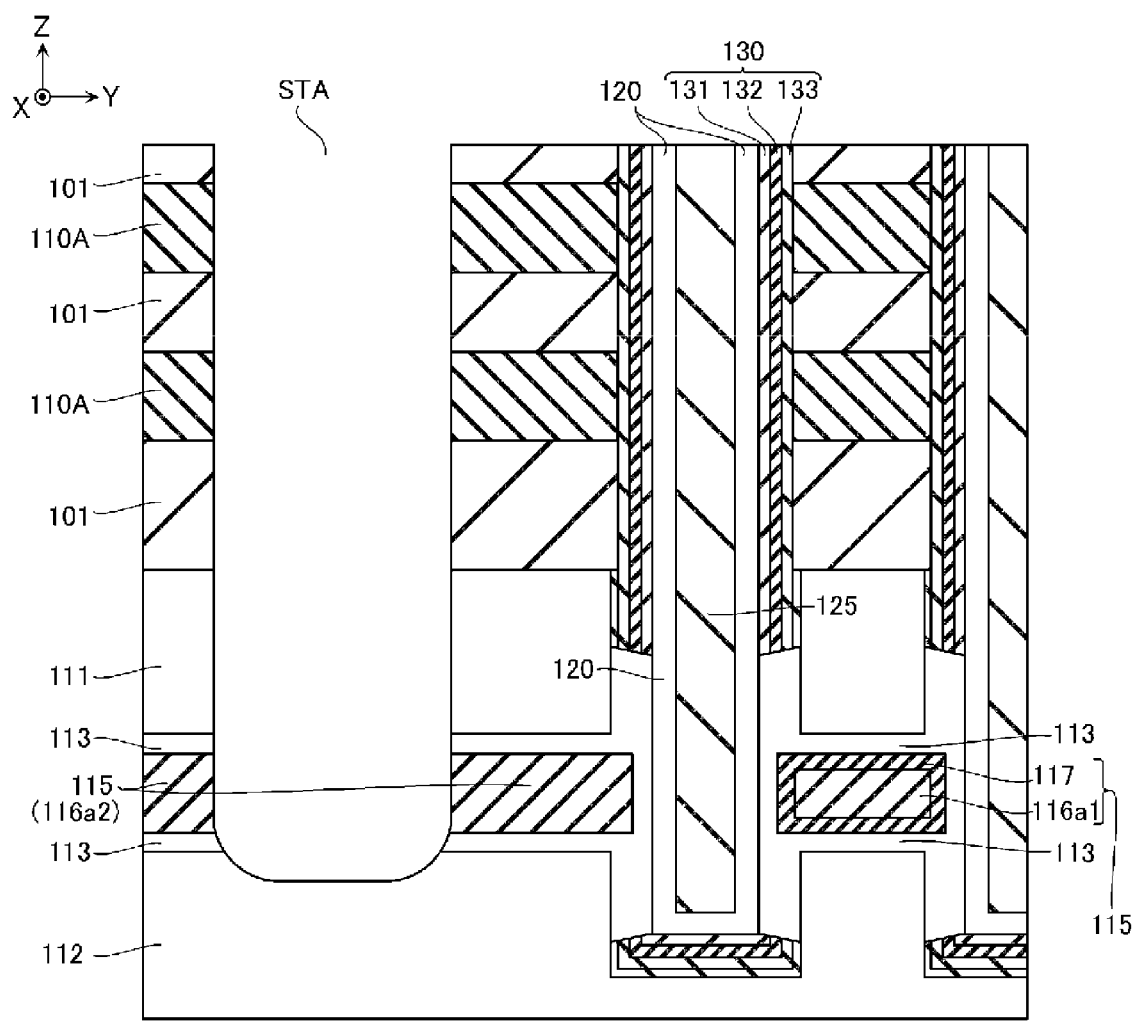
FIG. 26 is a schematic cross-sectional view illustrating a manufacturing method of the same semiconductor storage device.

Next, for example, as illustrated in FIG. 26, a portion of the insulating layer 116a' on the side surface of the trench STA in the Y direction is removed, and an insulating layer 116a2 is formed on the portion in contact with the side surface of the trench STA in the Y direction. This step is performed by, for example, a method such as a wet etching or the like.

Figure 27:
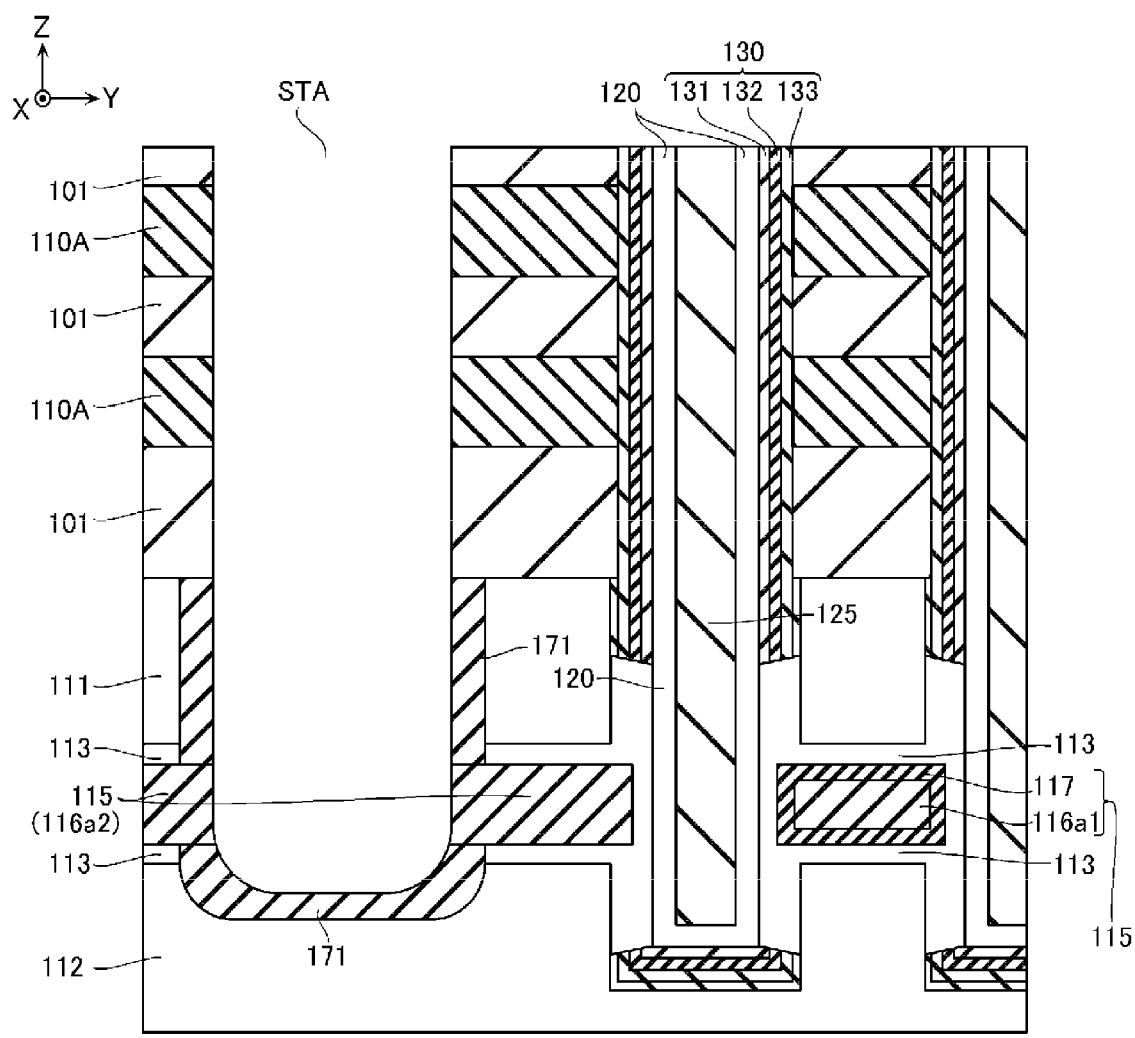
FIG. 27 is a schematic cross-sectional view illustrating a manufacturing method of the same semiconductor storage device.
Figure 28:
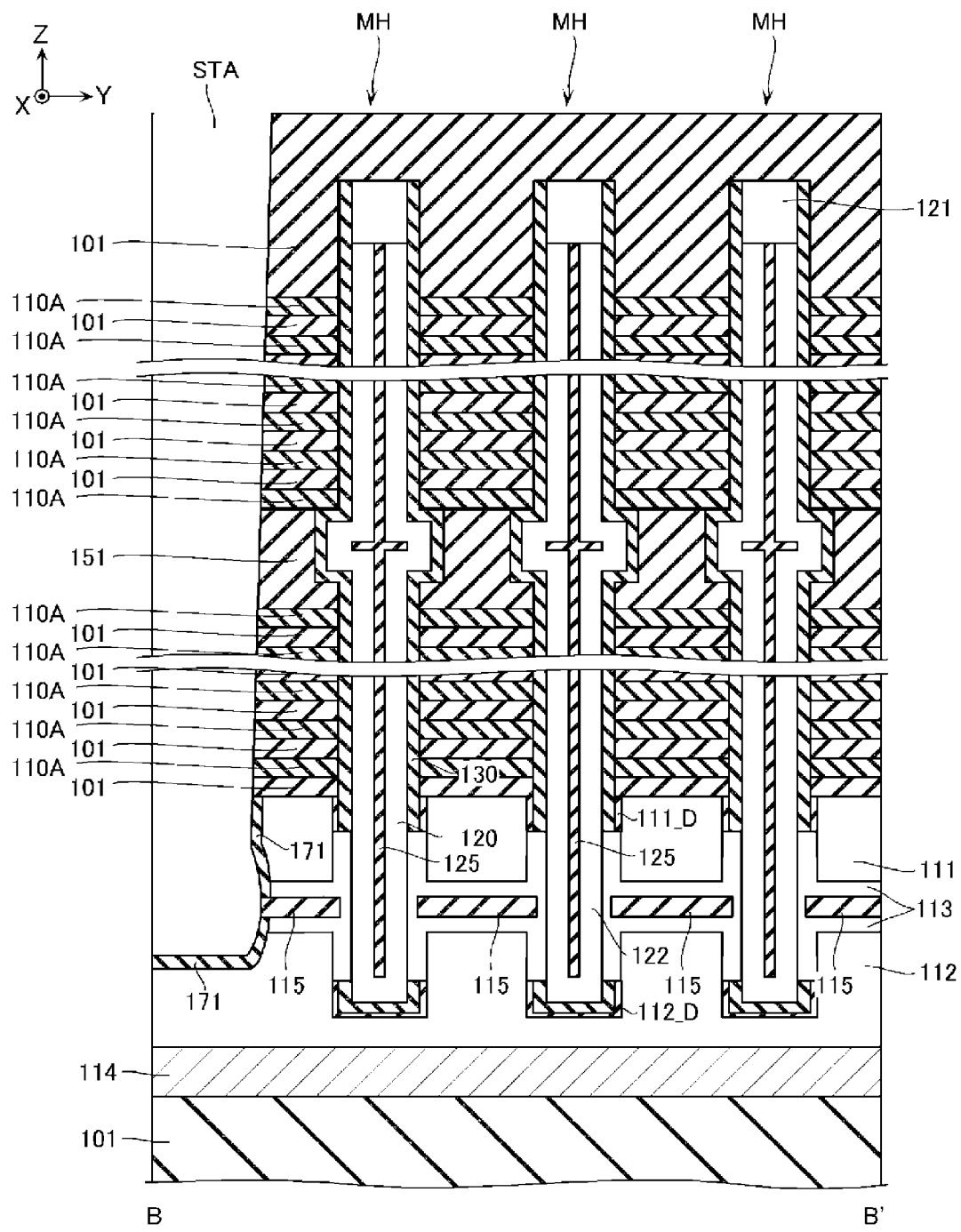
FIG. 28 is a schematic cross-sectional view illustrating a manufacturing method of the same semiconductor storage device.

Next, for example, as illustrated in FIGS. 27 and 28, an insulating layer 171 such as silicon oxide (SiO$_2$) or the like is formed in the portions of the semiconductor layer 111, 112, and 113 which are exposed to the trench STA. This step is performed by, for example, a thermal oxidation or the like.

Figure 29:
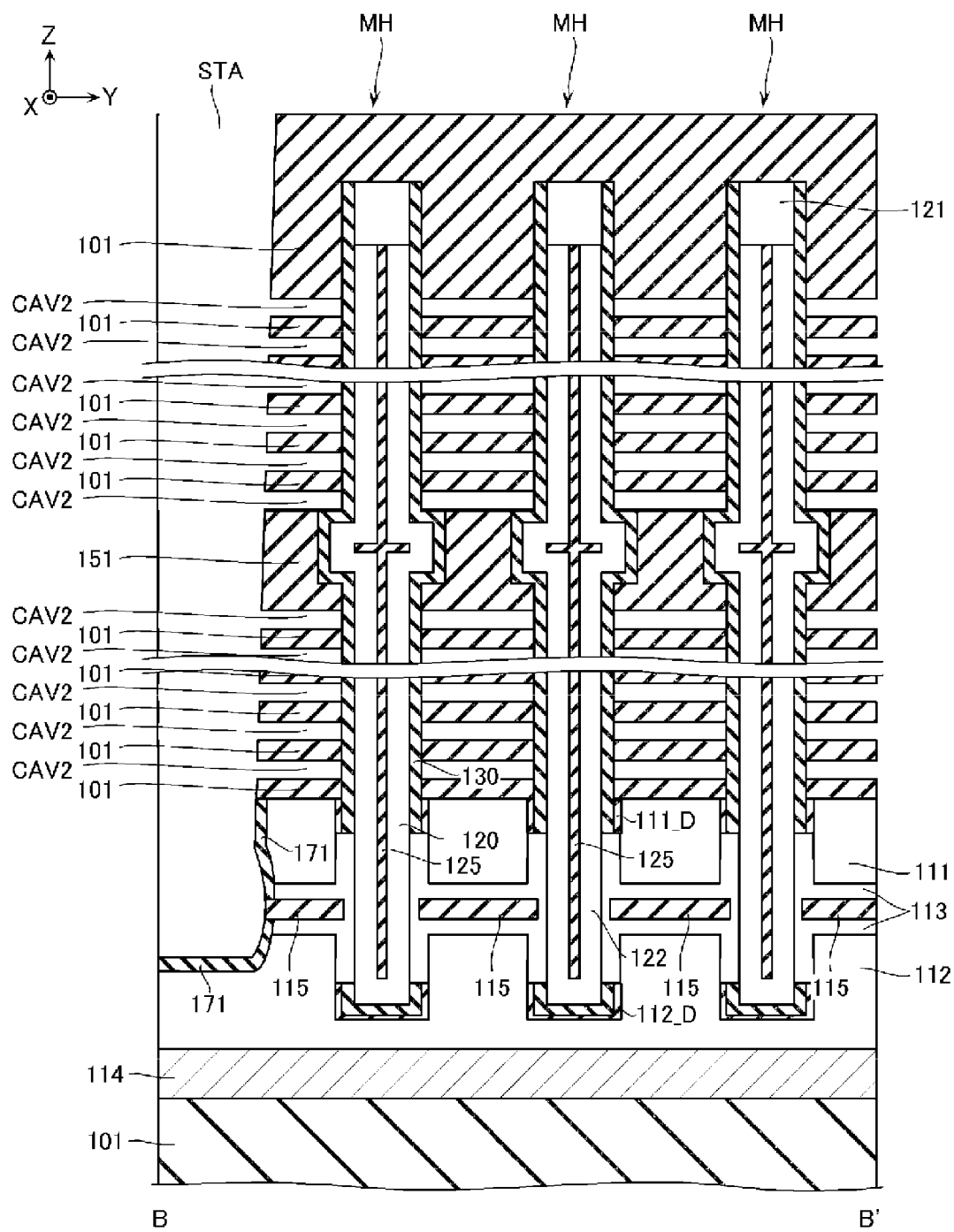
FIG. 29 is a schematic cross-sectional view illustrating a manufacturing method of the same semiconductor storage device.

Next, for example, as illustrated in FIG. 29, the sacrificial layer 110A is removed through the trench STA, to form a plurality of cavities CAV2. As a result, a hollow structure is formed which includes the plurality of insulating layers 101 arranged in the Z direction and the structure in the memory hole MH that supports the insulating layers 101 (the semiconductor layer 120, the gate insulating film 130, and the insulating layer 125). This step is performed by, for example, a method such as a wet etching or the like.

Figure 30:
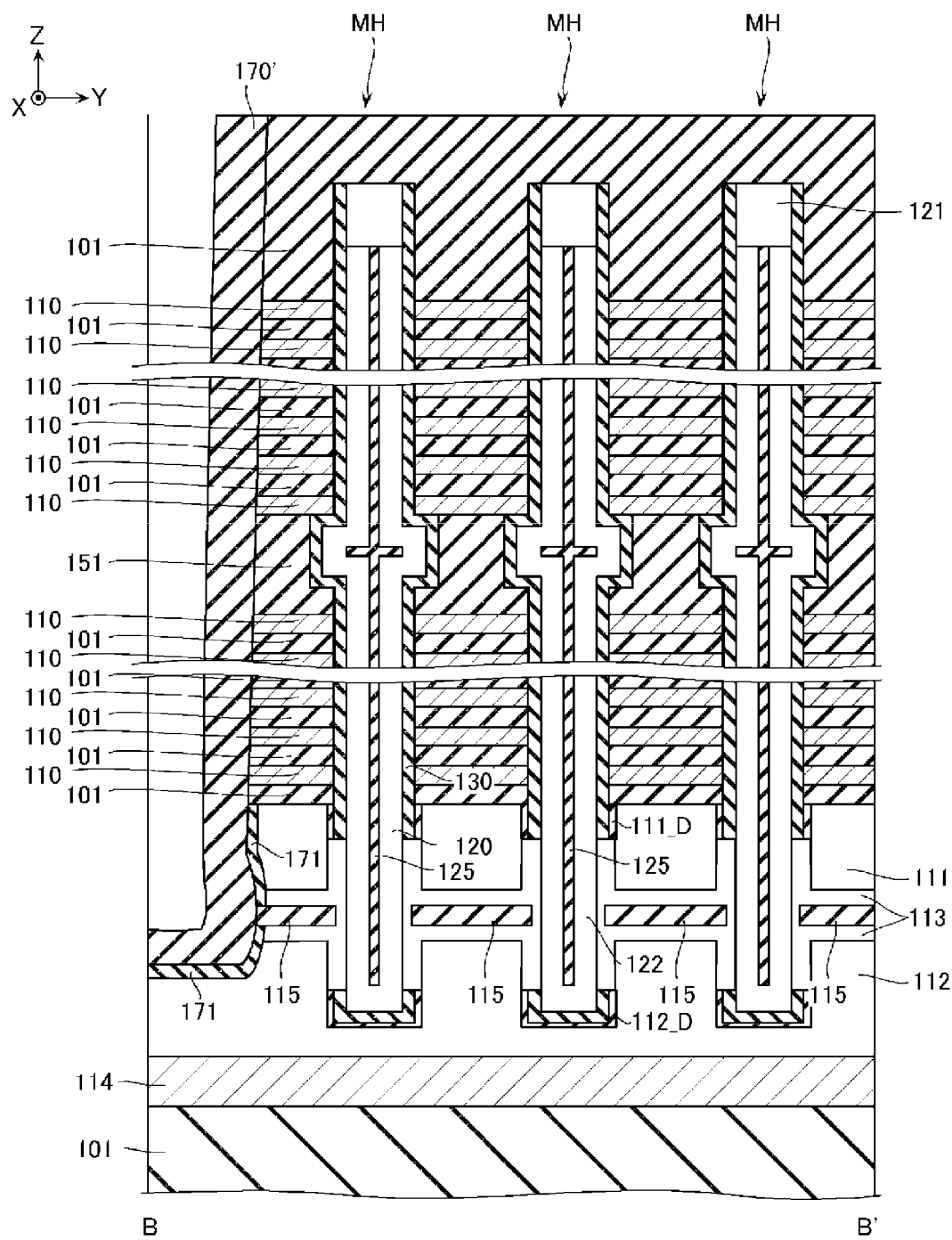
FIG. 30 is a schematic cross-sectional view illustrating a manufacturing method of the same semiconductor storage device.

Next, for example, as illustrated in FIG. 30, conductive layers 110 are formed in the cavities CAV2. This step is performed by, for example, a method such as CVD or the like.

Next, for example, as illustrated in FIG. 30, an insulating layer 170' such as silicon oxide (SiO$_2$) or the like is formed in the trench STA. This step is performed by, for example, a method such as CVD or the like.

Figure 31:
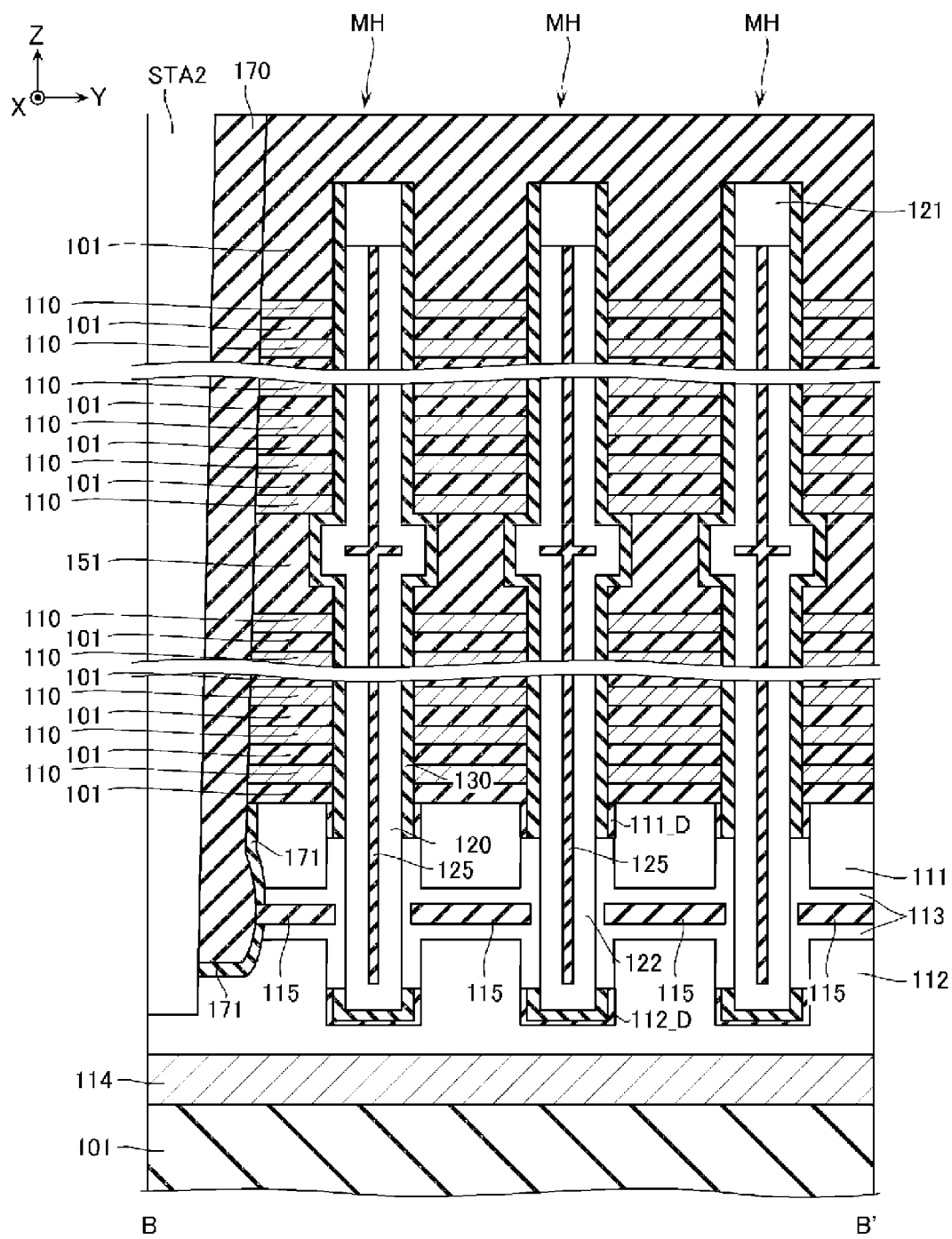
FIG. 31 is a schematic cross-sectional view illustrating a manufacturing method of the same semiconductor storage device.

Next, for example, as illustrated in FIG. 31, a trench STA2 is formed. The trench STA2 is formed by removing a portion of the insulating layer 170' and a portion of the insulating layer 171 from the bottom surface of the trench STA, and exposing the semiconductor layer 112. This step is performed by, for example, by RIE or the like.

Next, a barrier conductive layer 172 and a conductive layer 173 are formed in the trench STA2, and further, the contact Ch connected to the impurity region 121, the insulating layer SHE between string units and others are formed, so that the structure described above with reference to FIG. 5 is formed.

Comparative Example

Figure 32:
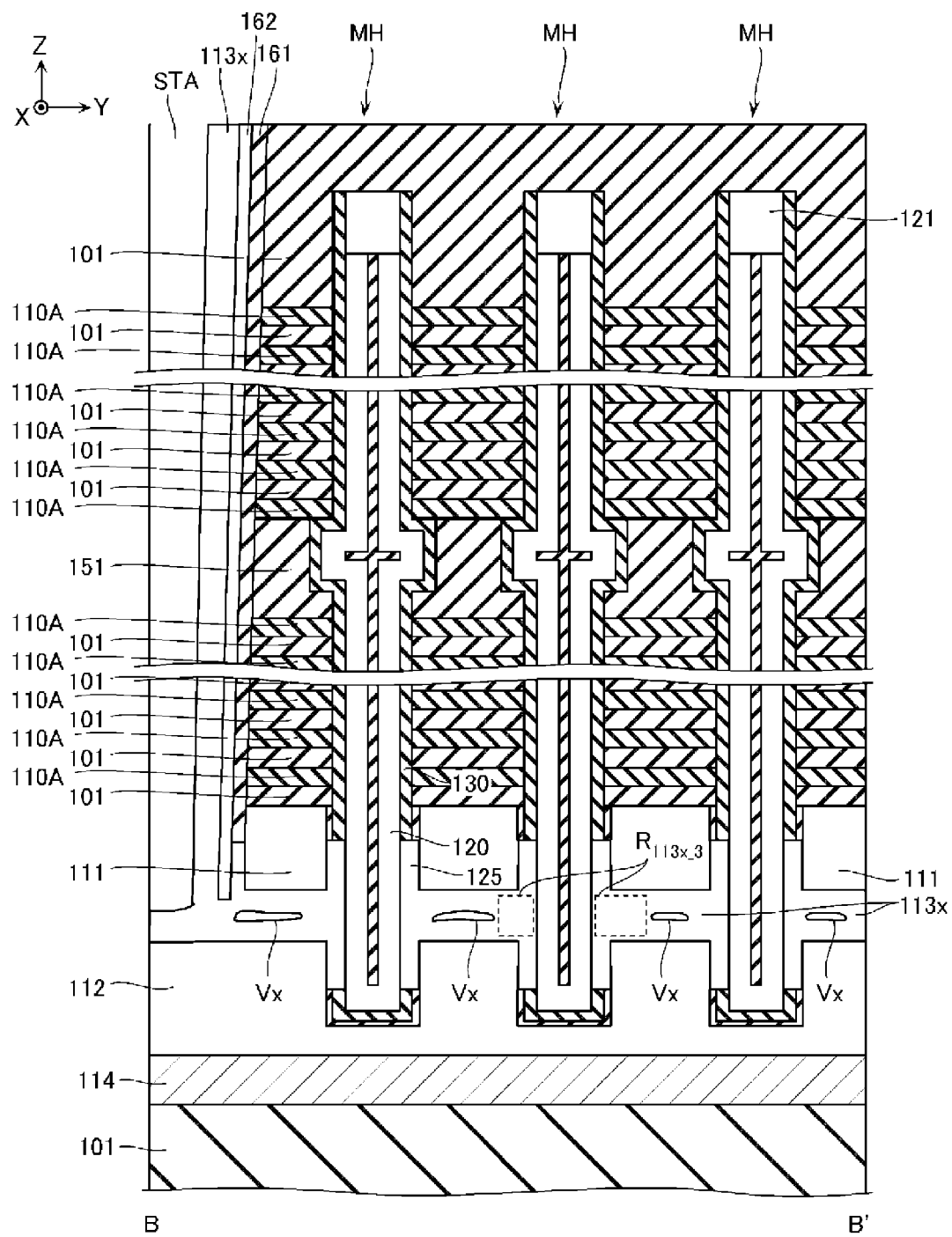
FIG. 32 is a schematic cross-sectional view illustrating a manufacturing method of a semiconductor storage device according to a comparative example.

Next, a semiconductor storage device according to a comparative example will be described with reference to FIG. 32. FIG. 32 is a schematic cross-sectional view illustrating a manufacturing method of a semiconductor storage device according to a comparative example.

In the manufacturing method of the semiconductor memory according to the comparative example, the steps described above with reference to FIGS. 21 to 26 (the formation of the semiconductor layer 113 and the insulating layer 115) are not performed. In the manufacturing method of the semiconductor storage device according to the comparative example, a semiconductor layer 113x is formed in the step corresponding to FIG. 21, as illustrated in FIG. 32. The semiconductor layer 113x is formed to have a thickness larger than that of the semiconductor layer 113' so as to fill up the entire cavity CAV1. The semiconductor layer 113x contains, for example, polycrystalline silicon (Si) containing impurities such as phosphorus (P), boron (B) or the like.

Here, in the step of forming the semiconductor layer 113x and filling up the cavity CAV1, it is difficult to completely fill up the cavity CAV1 (FIG. 20), and a void Vx may relatively easily occur as illustrated in FIG. 32. When a large number of voids Vx are present, the semiconductor layer 113x may be easily damaged in subsequent manufacturing processes.

Further, in the manufacturing method of the semiconductor storage device according to the comparative example, the radial thickness of a region $R_{113x\_3}$ in the portion of the semiconductor layer 113x in contact with the semiconductor layer 120 is larger than the radial thickness of a region $R_{113\_3}$ of the semiconductor storage device according to the first embodiment (FIG. 7). In this case, the grain diameter of polycrystalline silicon (Si) contained in the region $R_{113x\_3}$ may easily become larger than the grain diameter of polycrystalline silicon (Si) contained in the region $R_{113\_3}$. When the grain diameter is relatively large, manufacturing variations are likely to occur in each memory hole MH, such as a case where the grain boundary is in contact with the semiconductor layer 120, a case where the grain boundary is not in contact with the semiconductor layer 120, and other cases. Due to the manufacturing variations, a GIDL (gate induced drain leakage) current generated during an erase operation may significantly differ for each memory cell MC, thereby causing variations in erase characteristics of the memory cell MC.

[Effects]

As described above with reference to FIGS. 21 to 26, in the manufacturing method of the semiconductor storage device according to the present embodiment, the semiconductor layer 113' and the nitride film 163 which have a relatively small film thickness are formed, and then, the nitride film 163 is oxidized to form the insulating layer 115, and fill up the cavity CAV1 (FIG. 20). Through these steps, it is possible to prevent the occurrence of a large number of voids Vx described in the comparative example. As a result, the memory cells MC having the uniform characteristics may be very appropriately manufactured.

Further, in the manufacturing method of the semiconductor storage device according to the present embodiment, the radial thickness of the region $R_{113\_3}$ in contact with the semiconductor layer 120 may be made small. In this case, the increase of the grain diameter of polycrystalline silicon (Si) contained in the region $R_{113\_3}$ may be prevented. As a result, the relationship between the crystal grain boundary and the semiconductor layer 120 may be made close to the uniform state. Thus, the GIDL current generated during the erase operation is prevented from significantly differing for each memory cell MC, so that the memory cells MC having the uniform erase characteristics may be manufactured.

[Modification 1]

Figure 33:
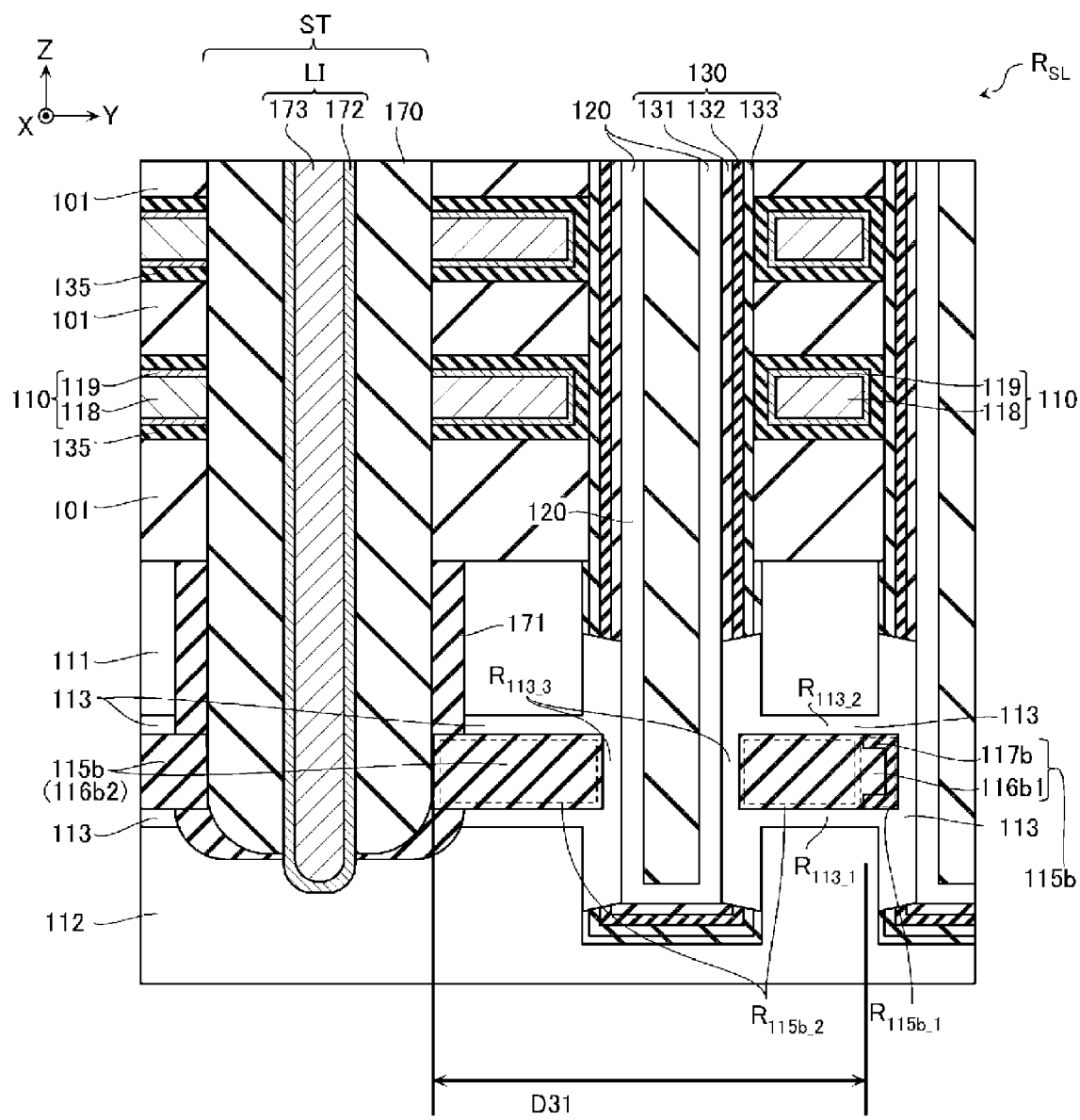
FIG. 33 is a schematic cross-sectional view illustrating a configuration of a portion of a semiconductor storage device according to Modification 1 of the first embodiment.

Next, Modification 1 of the semiconductor storage device according to the first embodiment will be described with reference to FIG. 33. FIG. 33 is a schematic cross-sectional view illustrating a configuration of a portion of a semiconductor storage device according to the present modification.

The semiconductor storage device according to the present modification is basically manufactured and configured in the same manner as the semiconductor storage device according to the first embodiment. It is noted that, in the manufacturing method of the semiconductor storage device according to the present modification, the nitride film 163 is oxidized to a region of a distance D31 longer than the distance D21' (FIG. 25) which is the distance from the trench STA (FIG. 25), during the step corresponding to FIG. 25. As a result, for example, as illustrated in FIG. 33, the semiconductor storage device according to the present modification includes an insulating layer 115b, instead of the insulating layer 115.

The insulating layer 115b includes a region $R_{115b\_1}$ of which the distance from the inter-block structure ST is longer than the distance D31 (FIG. 33), and a region $R_{115b\_2}$ of which the distance from the inter-block structure ST is shorter than the distance D21.

The region $R_{115b\_1}$ is provided with an insulating layer 116b1, and a nitride film 117b covering the upper surface, the lower surface, and the side surface of the insulating layer 116b1 far from the inter-block structure ST. The insulating layer 116b1 and the nitride film 117b may contain, for example, the same materials as those of the insulating layer 116a1 and the nitride film 117, respectively.

In the region $R_{115b\_2}$, an insulating layer 116a2 such as silicon oxide ($SiO_2$) is provided, and a nitride film containing nitrogen (N) is not provided.

[Modification 2]

Figure 34:
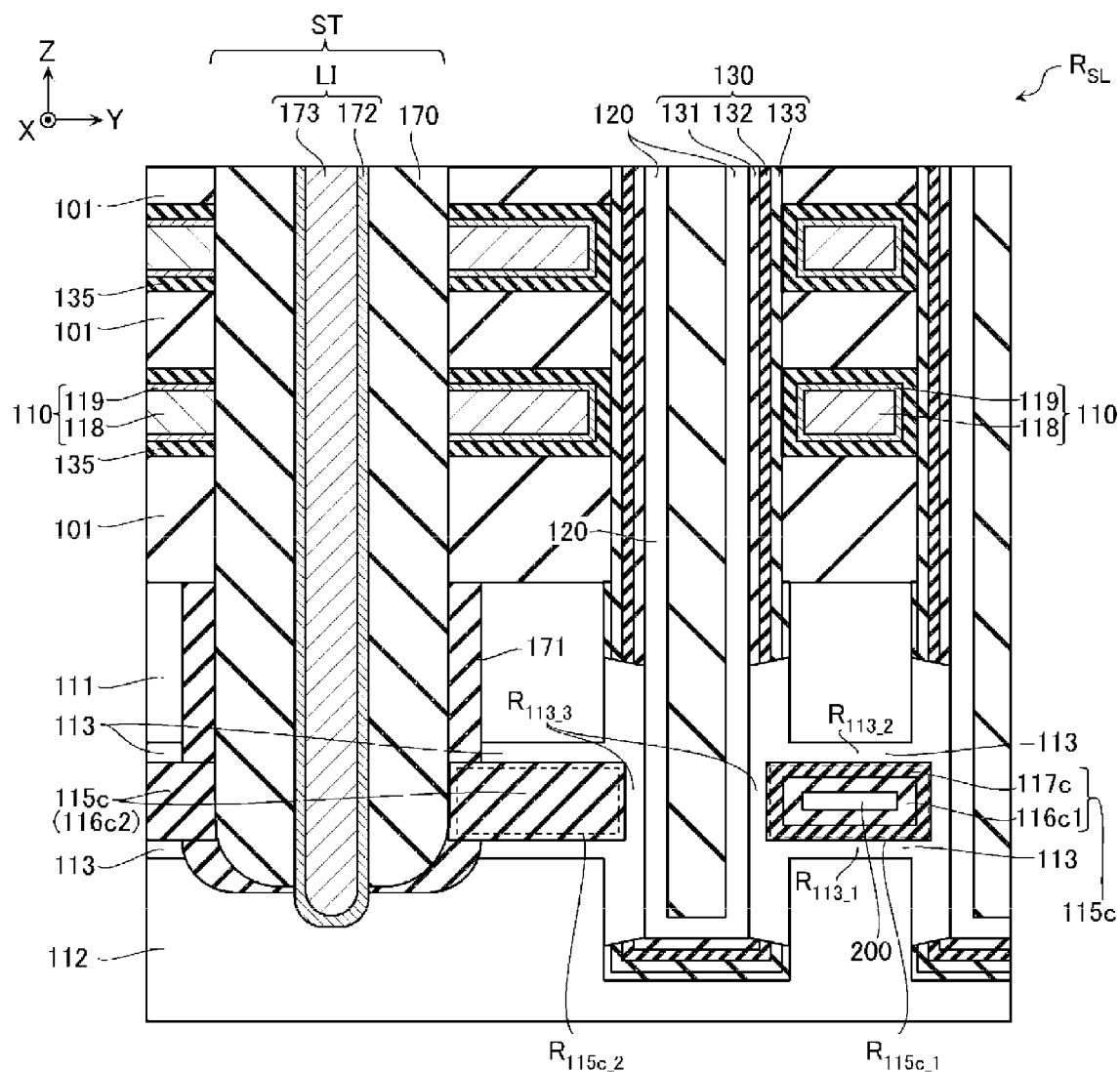
FIG. 34 is a schematic cross-sectional view illustrating a configuration of a portion of a semiconductor storage device according to Modification 2 of the first embodiment.

Next, Modification 2 of the semiconductor storage device according to the first embodiment will be described with reference to FIG. 34. FIG. 34 is a schematic cross-sectional view illustrating a configuration of a portion of the semiconductor storage device according to the present modification.

The semiconductor storage device according to the present modification is basically manufactured and configured in the same manner as the semiconductor storage device according to the first embodiment. It is noted that, for example, as illustrated in FIG. 34, the semiconductor storage device according to the present modification includes an insulating layer 115c, instead of the insulating layer 115.

The insulating layer 115c includes regions $R_{115c\_1}$ and $R_{11c\_2}$ provided at the same positions as those of the regions $R_{115\_1}$ and $R_{115\_2}$.

The region $R_{115c\_1}$ is provided with an insulating layer 116c1, a nitride film 117c covering the upper surface, the lower surface, and the side surface of the insulating layer 116c1, and a cavity 200 formed inside the insulating layer 116c1. The insulating layer 116c1 and the nitride film 117c may contain, for example, the same materials as those of the insulating layer 116a1 and the nitride film 117, respectively. The cavity 200 indicates, for example, a so-called space surrounded by the insulating layer 116c1, and the portion where the cavity 200 is formed does not contain a solid material. The cavity 200 may include, for example, air configured with a mixture of a plurality of gases such as nitrogen, oxygen, a noble gas and others. Meanwhile, the cavity 200 may be degassed so as not to include any gas.

In the region $R_{115c\_2}$, an insulating layer 116c2 such as silicon oxide ($SiO_2$) is provided, and a nitride film containing nitrogen (N) is not provided.

Second Embodiment

Figure 35:
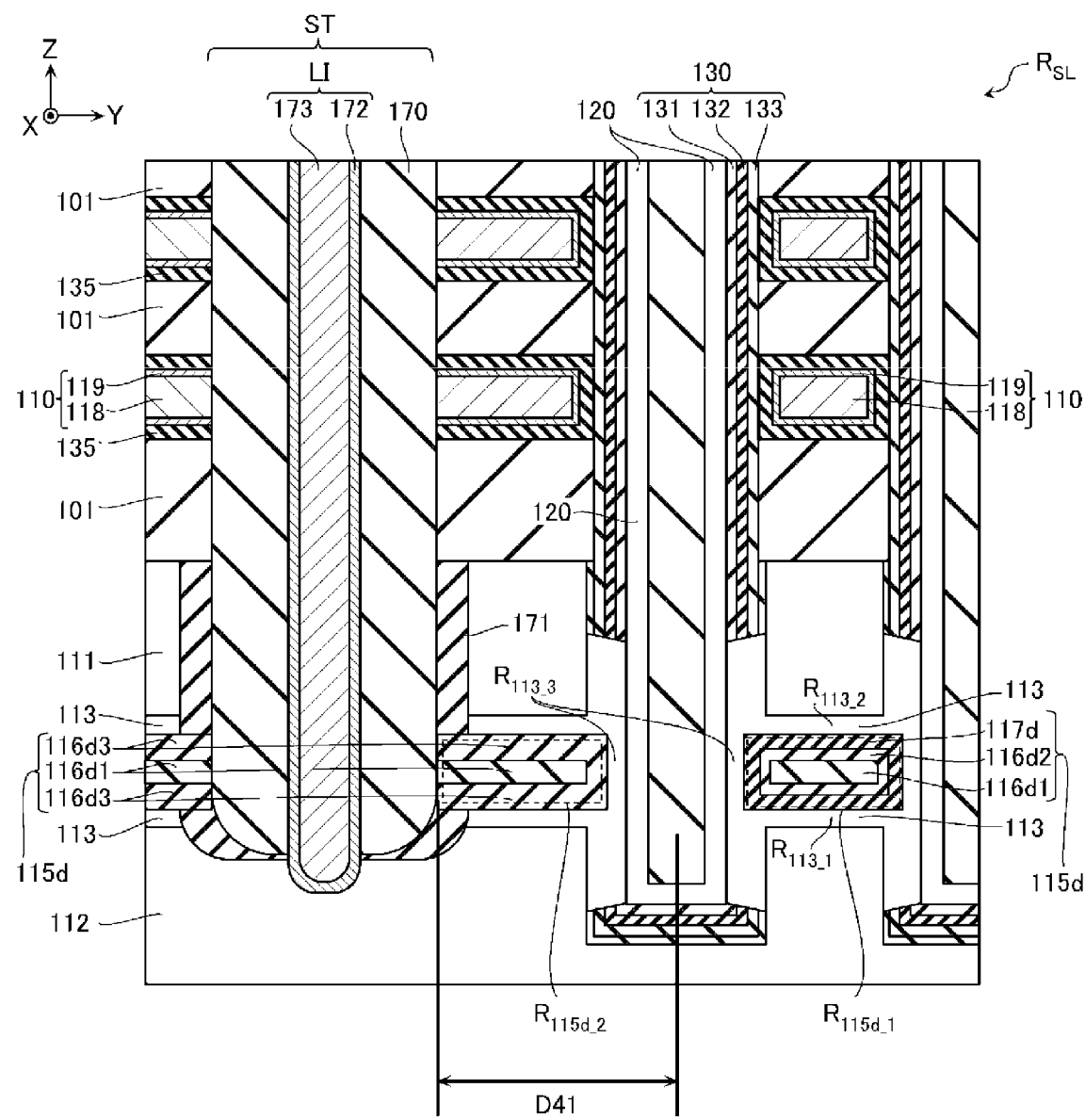
FIG. 35 is a schematic cross-sectional view illustrating a configuration of a portion of a semiconductor storage device according to a second embodiment.

Next, a semiconductor storage device according to a second embodiment will be described with reference to FIGS. 35 to 38. FIG. 35 is a schematic cross-sectional view illustrating a configuration of a portion of the semiconductor storage device according to the second embodiment, and represents the portion corresponding to FIG. 7. Meanwhile, in the following descriptions, descriptions of the same components as those in the first embodiment may be omitted.

The semiconductor storage device according to the present embodiment is basically configured in the same manner as the semiconductor storage device according to the first embodiment. It is noted that, for example, as illustrated in FIG. 35, the semiconductor storage device according to the second embodiment includes an insulating layer 115d, instead of the insulating layer 115.

[Insulation Layer 115d]

The insulating layer 115d includes a region $R_{115d\_1}$ of which the distance from the inter-block structure ST is longer than a distance D41 (FIG. 35), and a region $R_{115d\_2}$ of which the distance from the inter-block structure ST is shorter than the distance D41.

The region $R_{115d\_1}$ is provided with an insulating layer 116d1 and an insulating layer 116d2 covering the upper surface, the lower surface, and the side surface of the insulating layer 116d1. Further, a nitride film 117d is provided at the position covering at least a portion of the upper surface, the lower surface, and the side surface of the insulating layer 116d2. The insulating layers 116d1 and 116d2 are, for example, silicon oxide ($SiO_2$) or the like. Further, the insulating layers 116d1 and 116d2 may contain silicon oxides ($SiO_2$) or the like having different densities from each other. The nitride film 117d may contain, for example, the same material as that of the nitride film 117.

In the region $R_{115d\_2}$, for example, insulating layers 116d1 and 116d3 such as silicon oxide ($SiO_2$) or the like are provided, and a nitride film containing nitrogen (N) is not provided. Meanwhile, since the insulating layers 116d2 and 116d3 are formed according to the same process by the manufacturing method to be described later, the densities of the insulating layers 116d2 and 116d3 may be substantially the same.

Further, the insulating layers 116d1, 116d2, and 116d3 may contain at least one element of phosphorus (P) and arsenic (As). Further, the concentration of the element in the insulating layers 116d1, 116d2, and 116d3 may be larger than the concentration of the element in, for example, the insulating layer 101.

[Manufacturing Method]

Figure 36:
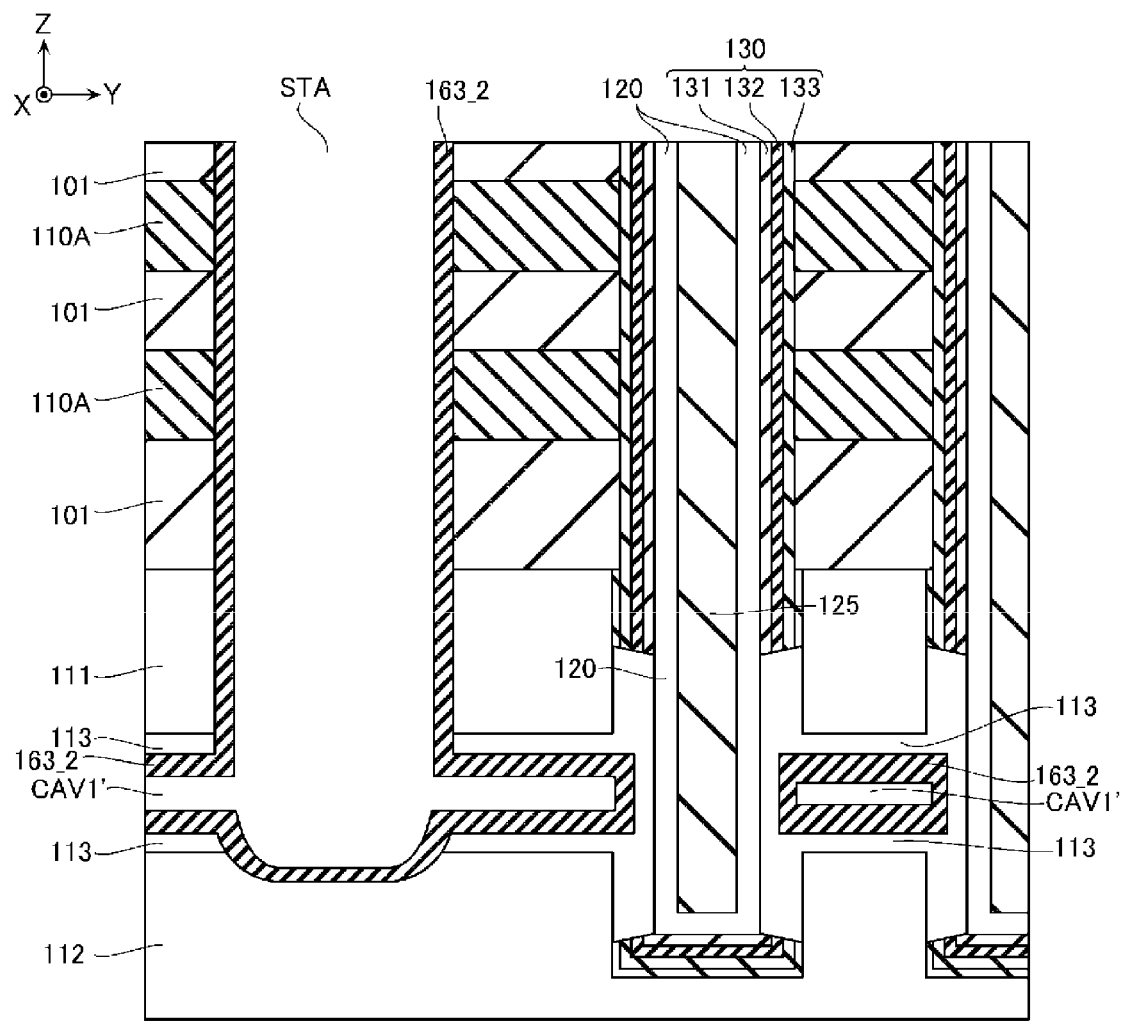
FIG. 36 is a schematic cross-sectional view illustrating a manufacturing method of the same semiconductor storage device.
Figure 37:
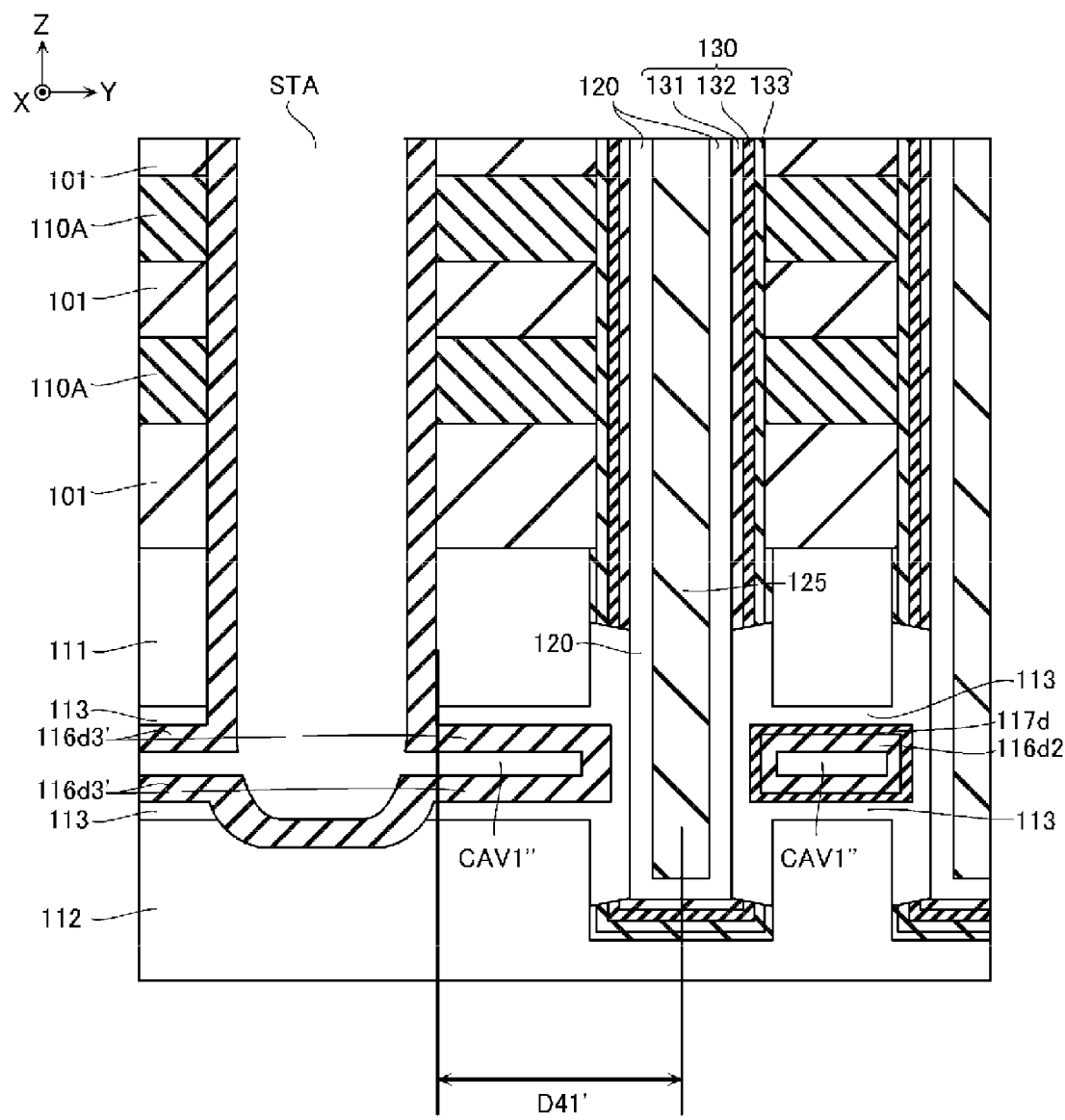
FIG. 37 is a schematic cross-sectional view illustrating a manufacturing method of the same semiconductor storage device.
Figure 38:
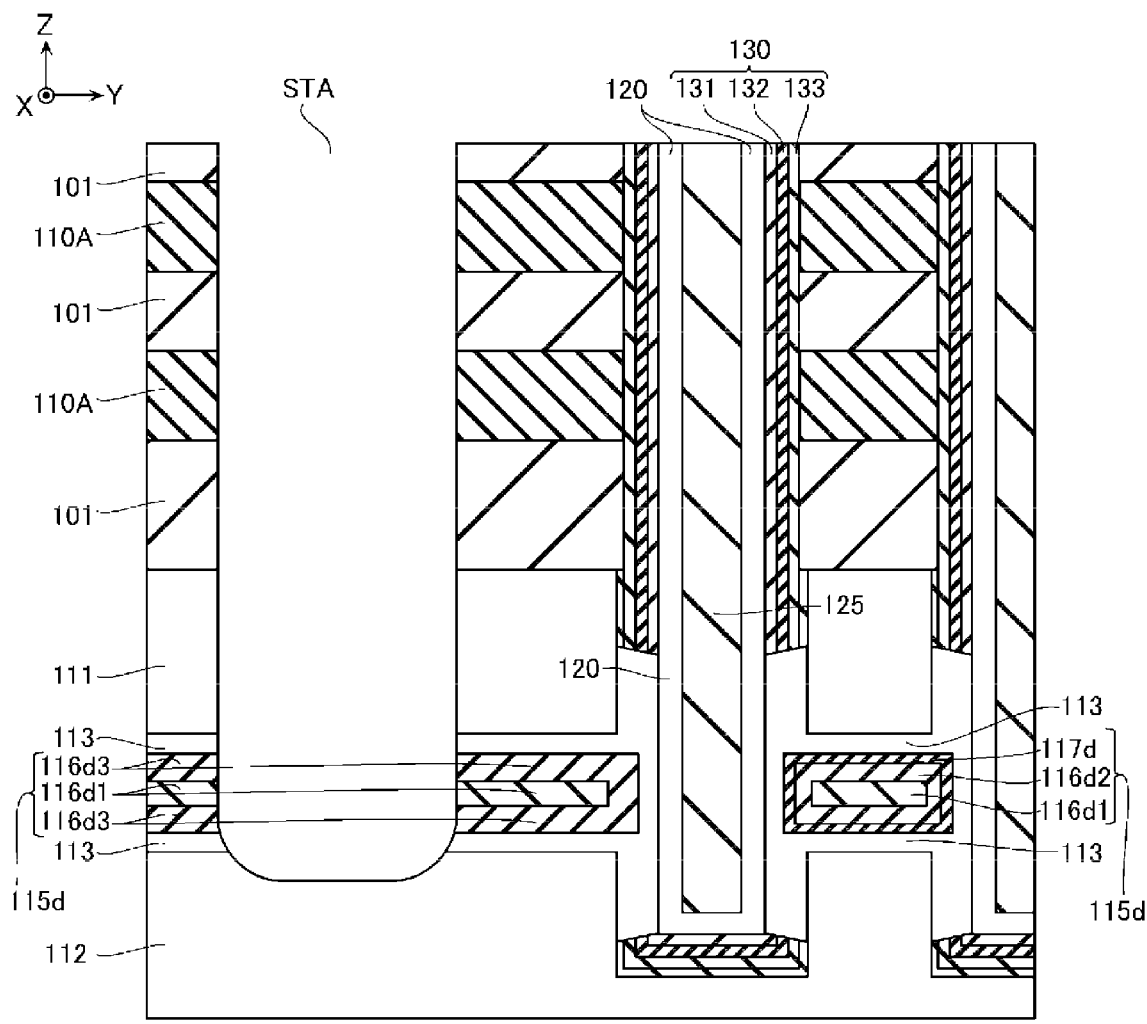
FIG. 38 is a schematic cross-sectional view illustrating a manufacturing method of the same semiconductor storage device.

Next, the manufacturing method of the semiconductor storage device according to the second embodiment will be described with reference to FIGS. 36 to 38. FIGS. 36 to 38 are schematic cross-sectional views illustrating the manufacturing method, and represent the cross section corresponding to FIG. 35.

The semiconductor storage device according to the second embodiment is basically manufactured in the same manner as the semiconductor storage device according to the first embodiment.

However, in the manufacturing method of the semiconductor storage device according to the second embodiment, a nitride film 163_2 having a film thickness smaller than that of the nitride film 163 is formed, instead of the nitride film 163, in the step corresponding to FIG. 24, as illustrated in FIG. 36. The nitride film 163_2 contains the same material as that of the nitride film 163. This step is performed by, for example, a method such as CVD or the like.

Next, for example, as illustrated in FIG. 37, the nitride film 163_2 is oxidized through the trench STA and the cavity CAV1', and insulating layers 116d3' and 116d2 such as silicon oxide ($SiO_2$) are formed on the side surface of the trench STA in the Y direction and in a portion of the location of the cavity CAV1' in the previous step. In the present step, for example, as illustrated in FIG. 37, the nitride film 163_2 is completely oxidized, and an insulating layer 116d3' is formed, at the position of which the distance from the trench STA is shorter than a distance D41'. At the position of which the distance from the trench STA is longer than the distance D41', the nitride film 163_2 is not completely oxidized, and only the portion of the nitride film 163_2 close to the cavity CAV1' is oxidized. Thus, at the position of which the distance from the trench STA is longer than the distance D41', the insulating layer 116d2 is formed in the portion where the nitride film 163_2 is oxidized, and the nitride film 117d is formed in the portion where the nitride film 163_2 is not oxidized. Meanwhile, when the nitride film 163_2 is oxidized, the volume of the oxidized portion increases, but due to the relatively small film thickness of the nitride film 163_2, a cavity CAV1" smaller than the cavity CAV1' remains in the portion of the cavity CAV1' in the previous step. This step is performed by, for example, by a method such as a plasma oxidation or the like.

Next, for example, as illustrated in FIG. 38, an insulating layer 116d1 is formed in the cavity CAV1" through the trench STA. This step is performed by, for example, a method such as low temperature CVD or the like.

Next, for example, as illustrated in FIG. 38, a portion of the insulating layers 116d3' and 116d1 is removed from the side surface of the trench STA in the Y direction, and an insulating layer 115d including insulating layers 116d1 and 116d3 is formed at the portion in contact with the side surface of the trench STA in the Y direction.

Next, for example, the steps corresponding to FIGS. 27 to 31 and others are performed to form the structure described above with reference to FIG. 35.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a plurality of first conductive layers arranged in a first direction;
   a first semiconductor layer extending in the first direction, and facing the plurality of first conductive layers;
   a gate insulating film including a third portion, a fourth portion, and a fifth portion, wherein the third portion is provided between the plurality of first conductive layers and the first semiconductor layer, and including a charge storage film, the fourth portion is provided below the third portion, physically connected to the third portion, and including the charge storage film, and the fifth portion is provided below the fourth portion, physically separated from the fourth portion and including the charge storage film;
   a first structure extending in the first direction and a second direction intersecting the first direction, and facing the plurality of first conductive layers;
   a second semiconductor layer connected to one end of the first semiconductor layer via the fifth portion of the gate insulating film, connected to one end of the first structure, and extending in the second direction;
   a third semiconductor layer provided between the second semiconductor layer and the plurality of first conductive layers, connected to the first semiconductor layer via the fourth portion of the gate insulating film, and extending in the second direction;
   a fourth semiconductor layer connected to the third semiconductor layer, and including a first portion provided along a bottom surface of the third semiconductor layer and a second portion provided along a top surface of the second semiconductor layer; and
   a first insulating layer provided between the first and second portions of the fourth semiconductor layer,
   wherein the first insulating layer including a first region of which a distance from the first structure is longer than a first distance, and
   a second region of which a distance from the first structure is shorter than the first distance,
   the first region contains a nitride film, and
   the second region does not contain nitrogen (N).

2. The semiconductor storage device according to claim 1, wherein the nitride film is in contact with at least one of the first portion or second portion of the fourth semiconductor layer, and extends in the second direction along the first and second portions of the fourth semiconductor layer.

3. The semiconductor storage device according to claim 1, wherein a distance between the first insulating layer and the first semiconductor layer is shorter than a distance between one of the plurality of first conductive layers and the first semiconductor layer.

4. The semiconductor storage device according to claim 1, wherein the first structure includes
   a second conductive layer extending in the first direction, and connected to the second semiconductor layer, and
   a fourth insulating layer provided between the plurality of first conductive layers and the second conductive layer.

5. The semiconductor storage device according to claim 1, wherein the first insulating layer contains at least one of phosphorus (P) or arsenic (As).

6. The semiconductor storage device according to claim 1, wherein the first insulating layer includes a cavity.

7. A manufacturing method of a semiconductor storage device comprising:
   forming a first semiconductor layer;
   forming a first sacrificial layer over the first semiconductor layer;
   forming a second semiconductor layer over the first sacrificial layer;
   forming, over the second semiconductor layer, a plurality of first films and a plurality of second films alternately stacked on top of one another;
   forming a first opening extending through the plurality of first films and the plurality of second films, the second semiconductor layer, and the first sacrificial layer;
   forming a gate insulating film lining the first opening;
   forming a third semiconductor layer over the gate insulating film;
   forming a second opening extending through the plurality of first films, the plurality of second films, and the second semiconductor layer;
   forming a cavity by removing a portion of the first sacrificial layer and a portion of the gate insulating film through the second opening;
   forming, at least in the cavity, a fourth semiconductor layer in contact with the first, second, and third semiconductor layers; and
   forming, at least in the cavity, a nitride film in contact with the fourth semiconductor layer; and
   oxidizing at least a portion of the nitride film, thereby forming an insulating layer in the cavity.

8. The manufacturing method of the semiconductor storage device according to claim 7, wherein the step of oxidizing the nitride film includes a plasma oxidization process.

9. The manufacturing method of the semiconductor storage device according to claim 7, subsequently to forming the insulating layer, further comprising forming an oxide film in the cavity according to a chemical vapor deposition (CVD) method.

10. The manufacturing method of the semiconductor storage device according to claim 7, further comprising forming a structure in the second opening.

11. The manufacturing method of the semiconductor storage device according to claim 10, wherein the insulating layer includes a first region of which a distance from the structure is longer than a first distance, and a second region of which a distance from the structure is shorter than the first distance, and wherein the first region contains a nitride film and the second region does not contain nitrogen (N).

12. The manufacturing method of the semiconductor storage device according to claim 10, wherein the structure includes an insulating layer surrounding a conductive core connected to the second semiconductor layer.

* * * * *